US012787456B2

(12) United States Patent
Tao et al.

(10) Patent No.: US 12,787,456 B2
(45) Date of Patent: Nov. 3, 2026

(54) PHOTOVOLTAIC MODULE AND METHOD FOR MANUFACTURING THE SAME

(71) Applicant: ZHEJIANG JINKO SOLAR CO., LTD., Haining (CN)

(72) Inventors: Wusong Tao, Haining (CN); Luchuang Wang, Haining (CN); Niannian Qin, Haining (CN); Yongqiao Song, Haining (CN); Xiangchao Han, Haining (CN)

(73) Assignee: ZHEJIANG JINKO SOLAR CO., LTD., Haining Zhejiang (CN)

( * ) Notice: Subject to any disclaimer, the term of this patent is extended or adjusted under 35 U.S.C. 154(b) by 0 days.

(21) Appl. No.: 19/069,230

(22) Filed: Mar. 4, 2025

(65) Prior Publication Data

US 2025/0338638 A1 Oct. 30, 2025

(30) Foreign Application Priority Data

Apr. 28, 2024 (CN) ......................... 202410524895.2

(51) Int. Cl.
*H10F 19/90* (2025.01)

(52) U.S. Cl.
CPC ................................. *H10F 19/904* (2025.01)

(58) Field of Classification Search
CPC ........ H10F 19/904; H10F 19/90; H10F 19/35; H10F 39/811
See application file for complete search history.

(56) References Cited

U.S. PATENT DOCUMENTS

2013/0213452 A1 8/2013 Ide et al.
2018/0062016 A1* 3/2018 Hyun .................... H10F 19/902

FOREIGN PATENT DOCUMENTS

| | | | |
|---|---|---|---|
| CN | 114388641 | A | 4/2022 |
| CN | 114649435 | A | 6/2022 |
| CN | 218414596 | U | 1/2023 |
| CN | 116387390 | A | 7/2023 |
| CN | 116504875 | A | 7/2023 |
| CN | 116705885 | A | 9/2023 |
| CN | 116722070 | A | 9/2023 |
| EP | 4120366 | A1 | 1/2023 |
| JP | 2023007295 | A | 1/2023 |
| WO | 2011095485 | A2 | 8/2011 |
| WO | 2019139239 | A1 | 7/2019 |

OTHER PUBLICATIONS

Zhejiang Jinko Solar Co., Ltd., European Search Report with English Translation, EP25161749.4, Aug. 26, 2025, 10 pgs.

* cited by examiner

*Primary Examiner* — Tae-Sik Kang
(74) *Attorney, Agent, or Firm* — USCH Law, PC

(57) ABSTRACT

Embodiments of the present disclosure relate to the technical field of photovoltaics, and provide a photovoltaic module and a method for manufacturing the same. The photovoltaic module includes: at least two cell strings spaced apart from one another in a first direction; solder ribbon structures, where a respective solder ribbon structure of the solder ribbon structures is disposed on a corresponding cell of the at least two cells of a corresponding cell string of the at least two cell strings; and intermediate interconnection structures, where a respective intermediate interconnection structure of the intermediate interconnection structures is electrically connected with a respective pair of adjacent cell strings of the at least two cell strings.

20 Claims, 10 Drawing Sheets

PHOTOVOLTAIC MODULE AND METHOD FOR MANUFACTURING THE SAME

CROSS REFERENCE TO RELATED APPLICATIONS

The present application claims the benefit of priority under the Paris Convention to Chinese Patent Application No. 202410524895.2 filed on Apr. 28, 2024, which is incorporated herein by reference in its entirety.

TECHNICAL FIELD

The various embodiments described in this document relate in general to the field of photovoltaics, and more specifically to a photovoltaic module and a method for manufacturing the same.

BACKGROUND

As the core unit of solar power generation, photovoltaic modules include cell string arrays. The cell strings are connected with each other by interconnection ribbons and current collectors, the current collectors are generally located in gaps between adjacent cell strings, and the interconnection ribbons are located at both ends of the cell strings and extend into the gaps of the cell strings to be welded on the current collectors.

Generally, current to be transmitted on the current collectors is larger than current to be transmitted on the interconnection ribbons, and thus, the current collector may have a larger cross-sectional area than a cross-sectional area of the interconnection ribbon, so that a larger spacing needs to be reserved between the cell strings to place the current collectors. In this way, it is easy to lead to a high area occupancy rate of the current collectors in the photovoltaic module, which affects the appearance and efficiency of the photovoltaic module.

SUMMARY

Embodiments of the present disclosure provide a photovoltaic module and a method for manufacturing the same, which may facilitate at least reducing spacings between adjacent cell strings in a first direction.

According to an aspect, embodiments of the disclosure provide a photovoltaic module. The photovoltaic module includes at least two cell strings spaced apart from one another in a first direction and electrically connected in sequence, where each respective cell string of the at least two cell strings includes at least two cells spaced apart from one another in the first direction and electrically connected in sequence, where each of the at least two cells includes electrodes arranged at intervals in a second direction intersecting the first direction, and the first direction and the second direction define a reference plane; solder ribbon structures, where a respective solder ribbon structure of the solder ribbon structures is disposed on a corresponding cell of the at least two cells of a corresponding cell string of the at least two cell strings, and the respective solder ribbon structure is in electrical contact with a corresponding electrode of the electrodes of the corresponding cell; and intermediate interconnection structures, where a respective intermediate interconnection structure of the intermediate interconnection structures is electrically connected with a respective pair of adjacent cell strings of the at least two cell strings, wherein one of the respective pair of adjacent cell strings has a first edge facing another one of the respective pair of adjacent cell strings and a first edge cell adjacent the first edge, the other one of the respective pair of adjacent cell strings has a second edge facing the first edge cell and a second edge cell adjacent the second edge, and the respective intermediate interconnection structure is at least partially located near the first edge and the second edge. The respective intermediate interconnection structure includes a first portion, a second portion, and a lead-out structure, where an orthographic projection of the first portion on the reference plane overlaps an orthographic projection of the first edge cell on the reference plane, and the first portion is in electrical contact with at least two solder ribbon structures disposed on the first edge cell. An orthographic projection of the second portion on the reference plane overlaps an orthographic projection of the second edge cell on the reference plane, and the second portion is in electrical contact with at least two solder ribbon structures disposed on the second edge cell, and where the lead-out structure is located at least on a side of the respective intermediate interconnection structure away from the first edge cell and the second edge cell in a third direction, where the third direction refers to a thickness direction of the first edge cell and the second edge cell.

In some embodiments, each two adjacent cells in the first direction in a same cell string are spaced by a first spacing, the first edge cell and the second edge cell in the first direction are spaced by a second spacing, and a ratio of the second spacing to the first spacing is in a range of 0.9 to 1.1.

In some embodiments, the first portion and the second portion are spaced by a first distance in the first direction, and the lead-out structure is in contact with at least a portion of a top surface of each of the first portion and the second portion away from the first edge cell and the second edge cell in the third direction.

In some embodiments, the lead-out structure is further in contact with at least a portion of each of at least one side surface, extending in the third direction, of each of at least one of the first portion and the second portion.

In some embodiments, the lead-out structure includes a contact portion and a lead-out portion that are connected with each other in the third direction, where the contact portion is in contact with both the first portion and the second portion, and the lead-out portion is located on a side of the contact portion away from the first edge cell and the second edge cell in the third direction. The contact portion has a first width in the first direction, and the first width is larger than the first distance.

In some embodiments, the contact portion includes a first sub-contact portion and a second sub-contact portion, the first sub-contact portion faces the first portion in the third direction, and the second sub-contact portion faces the second portion in the third direction. In the first direction, the first sub-contact portion has a second width, the first portion has a third width, and a ratio of the second width to the third width is greater than or equal to 0.4; and/or the second sub-contact portion has a fourth width, the second portion has a fifth width, and a ratio of the fourth width to the fifth width is greater than or equal to 0.4.

In some embodiments, the first width is greater than or equal to 2 mm in the first direction.

In some embodiments, the contact portion includes a first sub-contact portion and a second sub-contact portion, the first sub-contact portion faces the first portion in the third direction, and the second sub-contact portion faces the second portion in the third direction. In the second direction, the first sub-contact portion has a first length, the first portion has a second length, and a ratio of the first length to the second length is less than or equal to ⅓; and/or the second sub-contact portion has a third length, the second portion has a fourth length, and a ratio of the third length to the fourth length is less than or equal to ⅓.

In some embodiments, the respective intermediate interconnection structure further includes a third portion, the third portion is located between the first portion and the second portion, and the third portion is in contact with both the first portion and the second portion. Each two adjacent cells in a same cell string in the first direction are spaced by a first spacing, the respective intermediate interconnection structure has a sixth width greater than the first spacing in the first direction, and the lead-out structure is in contact with at least a portion of a top surface of the respective intermediate interconnection structure away from the first edge cell and the second edge cell in the third direction.

In some embodiments, the lead-out structure has a maximum seventh width in the first direction, and the seventh width is less than or equal to the sixth width.

In some embodiments, the photovoltaic module has a plurality of peripheral cells located at both ends of the photovoltaic module respectively in the first direction. The photovoltaic module further includes a plurality of peripheral interconnection structures, where an orthographic projection of each respective peripheral interconnection structure of the plurality of peripheral interconnection structures and an orthographic projection of a respective peripheral cell of the plurality of peripheral cells on the reference plane overlap, and the respective peripheral interconnection structure is in electrical contact with at least two solder ribbon structures disposed on the respective peripheral cell of which orthographic projection on the reference plane overlaps that of the respective peripheral interconnection structure on the reference plane.

In some embodiments, the electrodes include first electrodes and second electrodes spaced and alternatingly arranged in the second direction, polarities of the first electrodes and the second electrodes are different, where the solder ribbon structures include first solder ribbon structures and second solder ribbon structures, where each respective first solder ribbon structure of the first solder ribbon structures is in electrical contact with a corresponding first electrode of the electrodes of the corresponding cell, and each respective second solder ribbon structure of the second solder ribbon structures is in electrical contact with a corresponding second electrode of the electrodes of the corresponding cell, where the intermediate interconnection structures include first intermediate interconnection structures and second intermediate interconnection structures, where each of the first intermediate interconnection structures is in electrical contact with at least two first solder ribbon structures disposed on a corresponding pair of cells and each of the second intermediate interconnection structures is in electrical contact with at least two second solder ribbon structures disposed on a corresponding pair of cells. The photovoltaic module further includes insulating structures at least located between the first intermediate interconnection structures and second electrodes of corresponding cells, and between the second intermediate interconnection structures and first electrodes of corresponding cells.

In some embodiments, each of a plurality of solder ribbon structures in electrical contact with the respective intermediate interconnection structure include a first segment, a third segment, and a second segment that connects the first segment and the third segment, where the first segment is in a same layer as at least a portion of a corresponding insulating structure of the insulating structures, the third segment is located on a side of the corresponding insulating structure away from a corresponding electrode in the third direction, and the third segment is located between the corresponding insulating structure and the respective intermediate interconnection structure. An orthographic projection of the first portion on the reference plane is located in the orthographic projection of the corresponding insulating structure on the reference plane, and an orthographic projection of the second portion on the reference plane is located in the orthographic projection of the corresponding insulating structure on the reference plane.

In some embodiments, a corresponding insulating structure of the insulating structures is further located in gaps between a plurality of solder ribbon structures in electrical contact with the respective intermediate interconnection structure in the second direction and covers a top surface of each of the first electrodes of each of the corresponding pair of cells or each of the second electrodes of each of the corresponding pair of cells in the third direction.

In some embodiments, each of the at least two cells includes a back contact solar cell, and the solder ribbon structures and the intermediate interconnection structures are located on back surfaces of back contact solar cells of the at least two cell strings.

According to another aspect, embodiments of the disclosure provide a method for manufacturing a photovoltaic module, including: providing at least two cell strings spaced apart from one another in a first direction, where each respective cell string of the at least two cell strings includes at least two cells spaced apart from one another in the first direction and electrically connected in sequence, where each of the at least two cells includes electrodes arranged at intervals in a second direction intersecting the first direction, and the first direction and the second direction define a reference plane; forming solder ribbon structures, where a respective solder ribbon structure of the solder ribbon structures is disposed on a corresponding cell of the at least two cells of a corresponding cell string of the at least two cell strings, and the respective solder ribbon structure is in electrical contact with a corresponding electrode of the electrodes of the corresponding cell; and forming intermediate interconnection structures. A respective intermediate interconnection structure of the intermediate interconnection structures is electrically connected with a respective pair of adjacent cell strings of the at least two cell strings, where one of the respective pair of adjacent cell strings has a first edge facing another one of the respective pair of adjacent cell strings and a first edge cell adjacent the first edge, the other one of the respective pair of adjacent cell strings has a second edge facing the first edge cell and a second edge cell adjacent the second edge, and the respective intermediate interconnection structure is at least partially located near the first edge and the second edge. The respective intermediate interconnection structure includes a first portion, a second portion, and a lead-out structure, where an orthographic projection of the first portion on the reference plane overlaps an orthographic projection of the first edge cell on the reference plane, and the first portion is in electrical contact with at least two solder ribbon structures disposed on the first edge cell, and where an orthographic projection of the second portion on the reference plane overlaps an orthographic projection of the second edge cell on the reference plane, and the second portion is in electrical contact with at least two solder ribbon structures disposed on the second edge cell, and where the lead-out structure is located at least on a side of the respective intermediate interconnection structure away from the first edge cell and the second edge cell in a third direction, such that the respective intermediate interconnection structure is electrically connected with the two adjacent cell strings in the first direction, where the third direction refers to a thickness direction of the first edge cell and the second edge cell.

In some embodiments, the electrodes include first electrodes and second electrodes arranged alternatingly at intervals in the second direction, and the first electrodes and the second electrodes have different polarities. Before forming the solder ribbon structures, the method further includes: forming insulating structures, where a respective insulating structure of the insulating structures is located at least on a portion of a top surface of each of electrodes of each of the first edge cell and the second edge cell, where a part of the respective insulating structure is located in a peripheral region of the first edge cell close to the second edge cell, and a remaining part of the respective insulating structure is located in a peripheral region of the second edge cell close to the first edge cell. Forming the solder ribbon structures includes: forming a respective first solder ribbon structure in electrical contact with a corresponding first electrode of the first electrodes of the electrodes of the corresponding cell and forming a respective second solder ribbon structure in electrical contact with a corresponding second electrode of the second electrodes of the electrodes of the corresponding cell, where one of the respective first solder ribbon structure and the respective second solder ribbon structure corresponding to a same cell includes a first segment, a third segment, and a second segment in contact with the first segment and the third segment, where the first segment is formed on a top surface of a corresponding electrode that is not covered by the respective insulating structure, and the third segment is formed on a side of the respective insulating structure away from the corresponding electrode in the third direction.

In some embodiments, the electrodes include first electrodes and second electrodes arranged alternatingly at intervals in the second direction, polarities of the first electrodes and the second electrodes are different, where the solder ribbon structures include first solder ribbon structures and second solder ribbon structures, where each of the first solder ribbon structures is in electrical contact with a corresponding first electrode of the first electrodes of the electrodes of the corresponding cell and each of the second solder ribbon structures is in electrical contact with a corresponding second electrode of the second electrodes of the electrodes of the corresponding cell. After forming the solder ribbon structures and before forming the intermediate interconnection structures, the method further includes: forming insulating structures, where a respective insulating structure of the insulating structures is located at least in gaps between a plurality of the first solder ribbon structures corresponding to a cell in the second direction, and is further located on a top surface of each of the second electrodes of the cell; or the respective insulating structure is located at least in gaps between a plurality of the second solder ribbon structures corresponding to the cell in the second direction, and is further located on a top surface of each of the first electrodes of the cell.

BRIEF DESCRIPTION OF THE DRAWINGS

One or more embodiments are illustrated by figures in the accompanying drawings corresponding thereto, and these illustrative descriptions do not limit the embodiments, and unless otherwise stated, the figures in the accompanying drawings do not limit the scale. In order to more clearly explain the technical solutions in the embodiments of the present disclosure or the conventional technology, the drawings that need to be used in the embodiments will be briefly introduced below. It is obvious that the drawings in the following description are merely some embodiments of the present disclosure, and for those skilled in the art, other drawings can be obtained according to these drawings without making creative efforts.

DETAILED DESCRIPTION OF THE EMBODIMENTS

In view of the above, it is known that the area occupancy rate of the current collectors in the photovoltaic module needs to be reduced.

Figure 1:
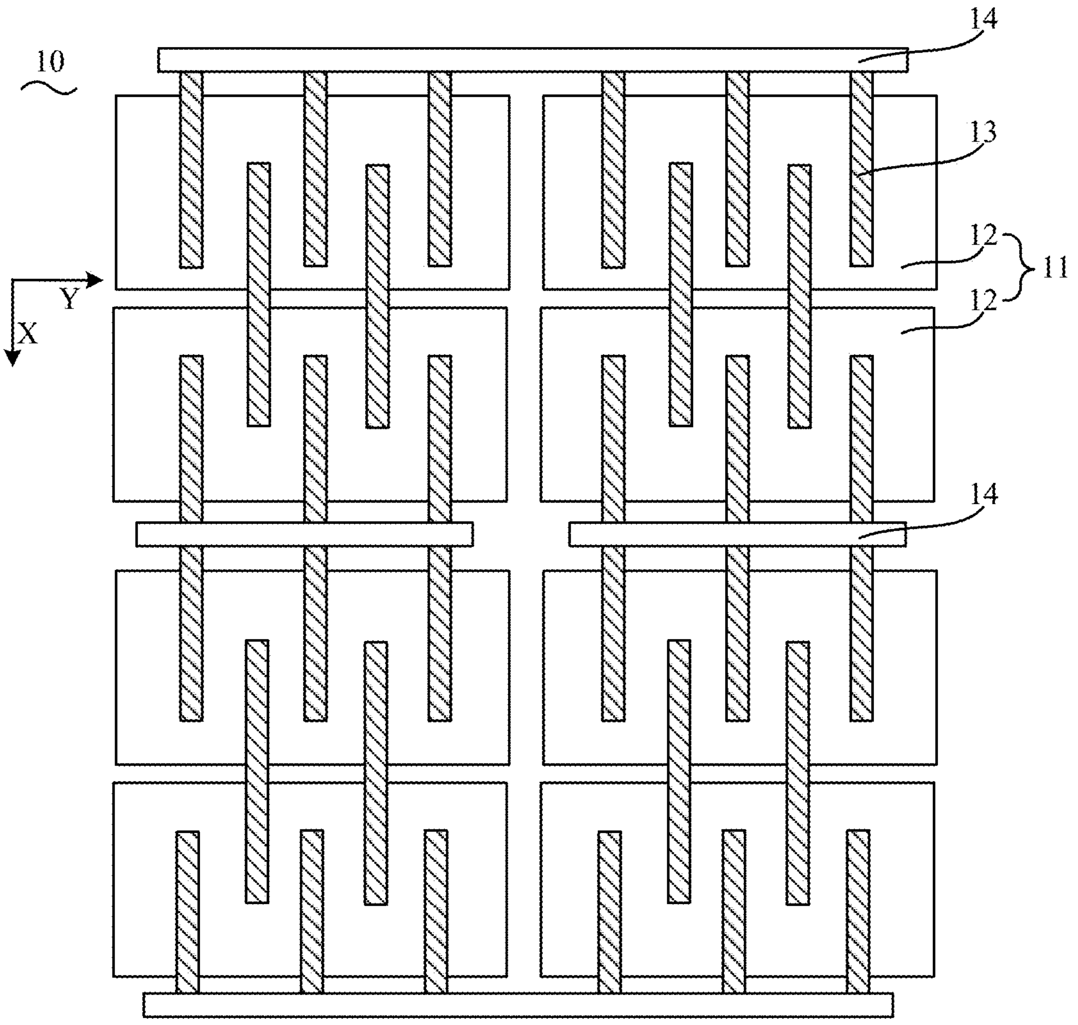
FIG. 1 is a top view of a photovoltaic module.

FIG. 1 is a top schematic view of a photovoltaic module. Referring to FIG. 1, the photovoltaic module 10 includes a plurality of cell strings 11 arranged at intervals in a first direction X and arranged at intervals in a second direction Y, where the first direction X and the second direction Y intersect. Each cell string 11 includes a plurality of solar cells 12 arranged at intervals in the first direction X and sequentially connected in series. For a same cell string 11, adjacent solar cells 12 are connected in series by interconnection ribbons 13, and each of the interconnection ribbons 13 can extend along the first direction X to be positioned on the two adjacent solar cells 12. Two adjacent cell strings 11 in the first direction X or in the second direction Y need to be connected by a current collector 14 to realize electrical connection between the two adjacent cell strings 11.

However, since the current collector needs to extend in the second direction Y to electrically connect the plurality of interconnection ribbons 13 on the cell strings 11, it is necessary to reserve a region between the adjacent cell strings 11 in the first direction X to place the current collector 14, so that there is a relatively large spacing between the adjacent cell strings 11 in the first direction X, which is not conducive to the close arrangement of the cell strings 11 in the photovoltaic module.

Embodiments of the present disclosure provide a photovoltaic module and a manufacturing method thereof. In the photovoltaic module, intermediate interconnection structures are provided. The intermediate interconnection structures are used to collect current on first edge cells and collect current on second edge cells, and realize electrical connection of two adjacent cell strings in a first direction. On basis of the above, an orthographic projection of a partial region of a respective intermediate interconnection structure on a reference plane is designed to coincide with the orthographic projection of a corresponding cell on the reference plane. In other words, the partial region of the respective intermediate interconnection structure is designed to be positioned on the corresponding cell in a third direction, so that there is no need to provide the entire intermediate interconnection structure in the spacing between the cell strings. In this way, it is possible to reduce the spacing between the adjacent cell strings in the first direction while satisfying the electrical function of the intermediate interconnection structure, so as to reduce the area occupied by the intermediate interconnection structure in the photovoltaic module, thereby increasing the arrangement density of the cell strings in the photovoltaic module, and improving the efficiency of the photovoltaic module.

In the description of the embodiments of the present disclosure, the technical terms "first", "second" and the like are only used to distinguish different objects, and could not be understood to indicate or imply relative importance or implicitly indicate the number, specific order, or primary-secondary relationship of the indicated technical features. In the description of the embodiments of the present disclosure, "a plurality" means two or more unless otherwise explicitly and specifically defined.

Reference herein to an "embodiment" means that a particular feature, structure, or characteristic described in connection with the embodiment may be included in at least one embodiment of the present disclosure. The appearance of the phrase in various places in the specification does not necessarily refer to the same embodiment, nor is it an independent or alternative embodiment that is mutually exclusive from other embodiments. It is explicitly and implicitly understood by those skilled in the art that the embodiments described herein may be combined with other embodiments.

In the description of the embodiment of the present disclosure, the term "and/or" is merely an association relationship describing an association object, and indicates that there may be three relationships, e.g., A and/or B, which may indicate that there is A, there are both A and B, and there is B. In addition, the character "/" in this article generally indicates that the related objects before and after are in an "or" relationship.

In the description of the embodiments of the present disclosure, the term "a plurality" refers to two or more (including two); similarly, "a plurality of groups" refers to two or more groups (including two), and "a plurality of pieces" refers to two or more pieces (including two).

In the description of the embodiments of the present disclosure, orientation or positional relationship indicated by the technical terms "center", "longitudinal", "transverse", "length", "width", "thickness", "upper", "lower", "front", "back", "left", "right", "vertical", "horizontal", "top", "bottom", "inner", "outer", "clockwise", "counterclockwise", "axial", "radial", "circumferential" and the like are based on the orientation or positional relationships shown in the drawings. This is merely for the convenience of describing the embodiments of this disclosure and simplifying the description, rather than indicating or implying that the referred device or element must have a specific orientation, be constructed and operated in a specific orientation, and thus which should not be construed as a limitation to the embodiments of this disclosure.

In the description of the embodiments of the present disclosure, unless otherwise explicitly specified and limited, technical terms such as "mounted/installed", "connected", "coupled/coupling" and "fixed" should be understood in a broad sense, for example, they may indicate a fixed connection, a detachable connection, or a one-piece. Alternatively, they may also indicate a mechanical connection or an electrical connection. Alternatively, they may also indicate a directly connection, or an indirectly connection through an intermediate medium, or indicate internal communication of two elements or the interaction of two elements. For those skilled in the art, the specific meanings of the above terms in the embodiments of the present disclosure can be understood according to specific circumstances.

In the drawings corresponding to the embodiments of the present disclosure, the thickness and area of the layers are enlarged for better understanding and convenience of description. When a component (such as a layer, thin film, region, or substrate) is described as being over another component or over the surface of another component, the component may be "directly" located on the surface of the other component, or a third component may be disposed between the two components. On the contrary, when it is described that one component is on the surface of another component or that one component is formed or provided with another component on the surface of the one component, it is indicated that there is no third component between the two components. Furthermore, when it is described that one component is "substantially" formed on another component, it is meant that the component is not formed on the entire surface (or front surface) of the other component, nor is it formed on a portion of the edge of the entire surface.

In the description of embodiments of the present disclosure, when a certain component "includes" another component, other components are not excluded unless otherwise specified, and other components may be further included. Furthermore, when a component such as a layer, film, region or plate is referred to as "on/located" on another component, it may be "directly" on the other component (i.e., located on the surface of the other component, and there is no other component therebetween) or may have the other component disposed therebetween. Furthermore, when a layer, film, region, plate, etc. is "directly located" on another component, or when a layer, film, region, plate, etc. is located on the surface of another component, it means that no other component is located therebetween.

The terminology used in the description of the various described embodiments herein is for the purpose of describing particular embodiments only and is not intended to be limiting. As used in the description of the various embodiments described and in the appended claims, “the component” is also intended to include the plural form unless the context clearly dictates otherwise. The component includes layer, film, region, or plate, for example.

Hereinafter, embodiments of the present disclosure will be described in detail with reference to the accompanying drawings. However, one of ordinary skill in the art will appreciate that in various embodiments of the present disclosure, many technical details are set forth in order to better understand the embodiments of the present disclosure by the reader. However, even without these technical details and various changes and modifications based on the following embodiments, the technical solutions claimed by the embodiments of the present disclosure can be realized.

Embodiments of the present disclosure provide a photovoltaic module, and the photovoltaic module provided in embodiments of the present disclosure will be described in detail below with reference to the accompanying drawings.

Referring in conjunction with FIGS. 2 to 6, a photovoltaic module 100 includes at least two cell strings 101 spaced apart from each other in a first direction X and electrically connected in sequence. Each of the at least two cell strings 101 includes at least two cells 111 spaced apart from each other in the first direction X and electrically connected in sequence. Each of the at least two cells 111 includes a plurality of grid lines (electrodes) 121 arranged at intervals in a second direction Y. The first direction X and the second direction Y intersect, and the first direction X and the second direction Y define a reference plane. The photovoltaic module 100 further includes solder ribbon structures 102. Each respective solder ribbon structure 102 of the solder ribbon structures 102 is disposed on a corresponding cell 111 of the at least two cells 111 of a corresponding cell string 101 of the at least two cell strings 101, and the respective solder ribbon structure 102 is in electrical contact with a corresponding electrode 121 of the corresponding cell 111. The photovoltaic module 100 further includes intermediate interconnection structures 103. A respective intermediate interconnection structure 103 of the intermediate interconnection structures 103 is electrically connected with a respective pair of adjacent cell strings 101 of the at least two cell strings 101. One of the respective pair of adjacent cell strings 101 has a first edge 1111 facing another one of the respective pair of adjacent cell strings 101 and a first edge cell 111*a* adjacent the first edge 1111, the other one of the respective pair of adjacent cell strings 101 has a second edge 1112 facing the first edge cell 1111 and a second edge cell 111*b* adjacent the second edge 1112. The respective intermediate interconnection structure 103 is at least partially located near the first edge 1111 and the second edge 1112 (i.e., the respective intermediate interconnection structure 103 is not located at an end of the photovoltaic module 100 in the first direction X). The respective intermediate interconnection structure 103 includes a first portion 113, a second portion 123, and a lead-out structure 133. An orthographic projection of the first portion 113 on the reference plane overlaps an orthographic projection of the first edge cell 111*a* on the reference plane. The first portion 113 is in electrical contact with at least two solder ribbon structures 102 disposed on the first edge cell 111*a*. An orthographic projection of the second portion 123 on the reference plane overlaps an orthographic projection of the second edge cell 111*b* on the reference plane. The second portion 123 is in electrical contact with at least two solder ribbon structures 102 disposed on the second edge cell 111*b*. The lead-out structure 133 is located at least on a side of the respective intermediate interconnection structure 103 away from a corresponding pair of cells 111 (i.e., the first edge cell 111*a* and the second edge cell 111*b*) in a third direction Z, where the third direction Z refers to a thickness direction of the corresponding pair of cells 111.

Figure 2:
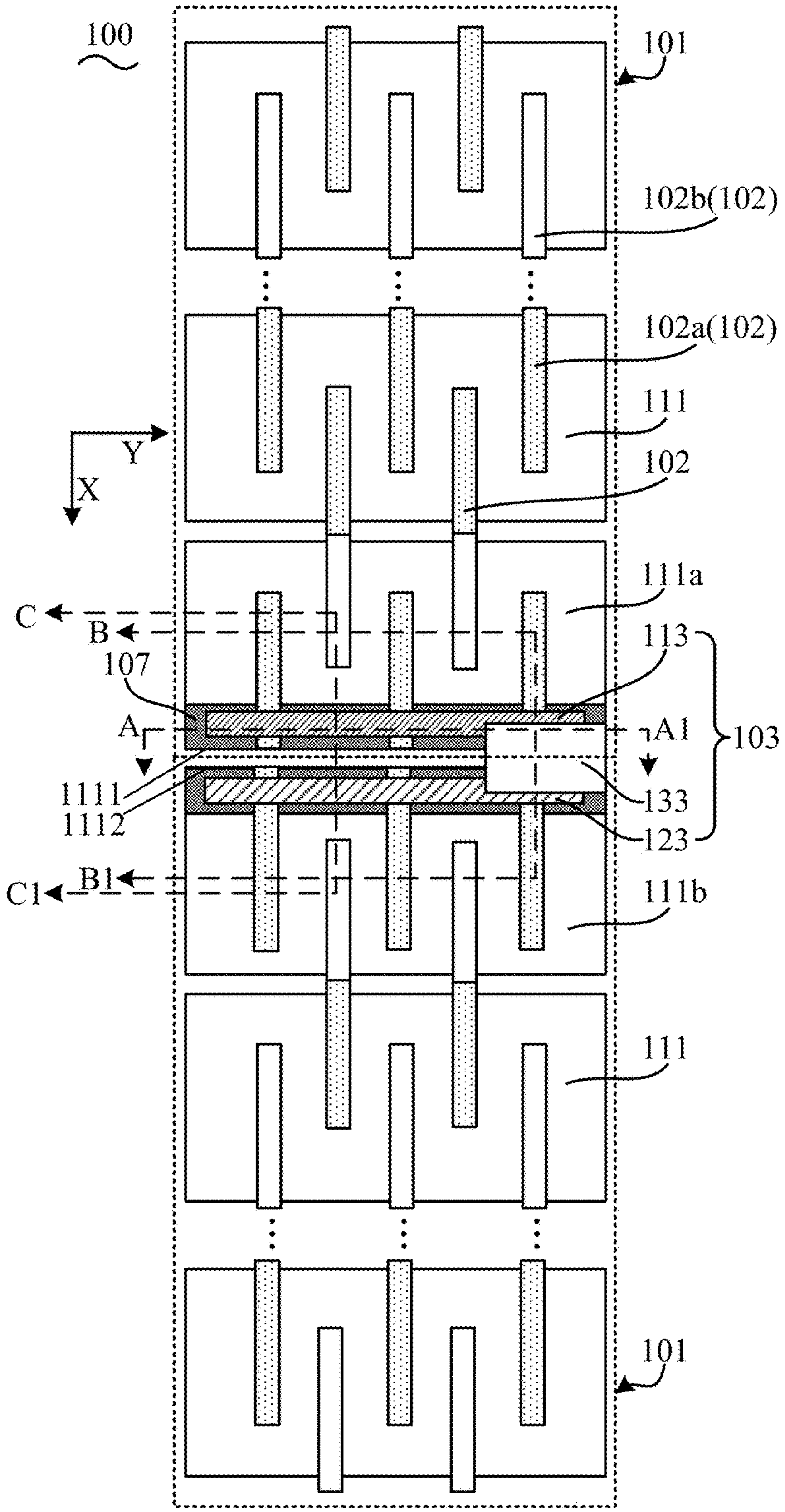
FIG. 2 is a first partial top view of a photovoltaic module according to an embodiment of the present disclosure.
Figure 3:
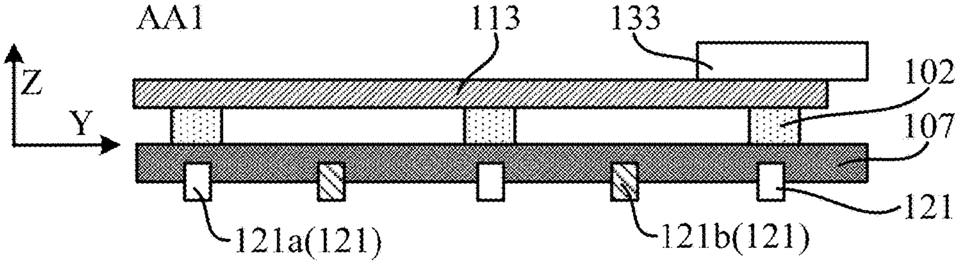
FIG. 3 is a partial cross-sectional structural schematic view of the photovoltaic module shown in FIG. 2 along a first cross-sectional direction AA1.
Figure 4:
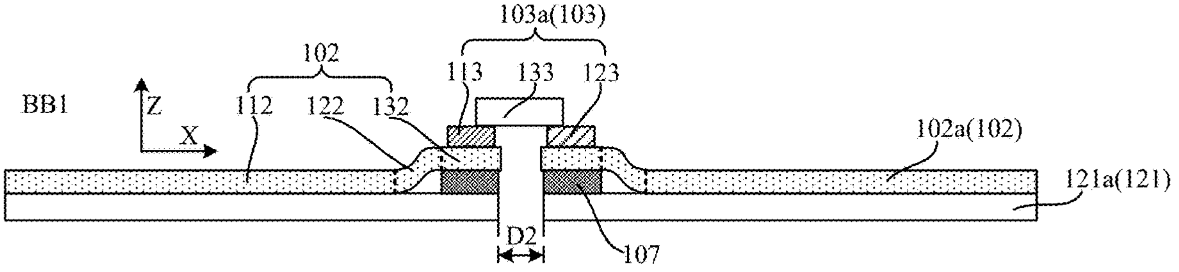
FIG. 4 is a partial cross-sectional structural schematic view of the photovoltaic module shown in FIG. 2 along the second cross-sectional direction BB1.
Figure 5:
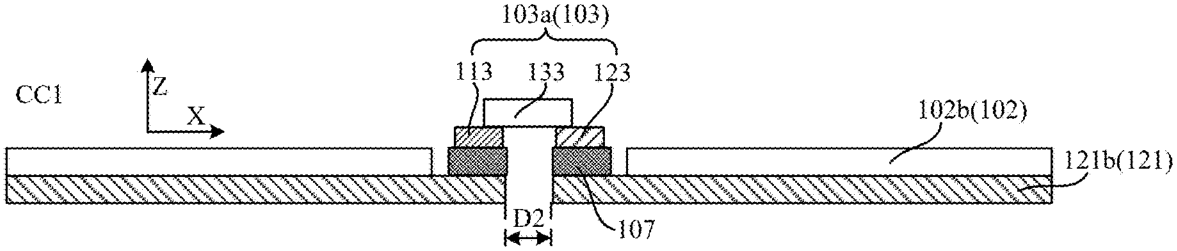
FIG. 5 is a partial cross-sectional structural schematic view of the photovoltaic module shown in FIG. 2 along a third cross-sectional direction CC1.
Figure 6:
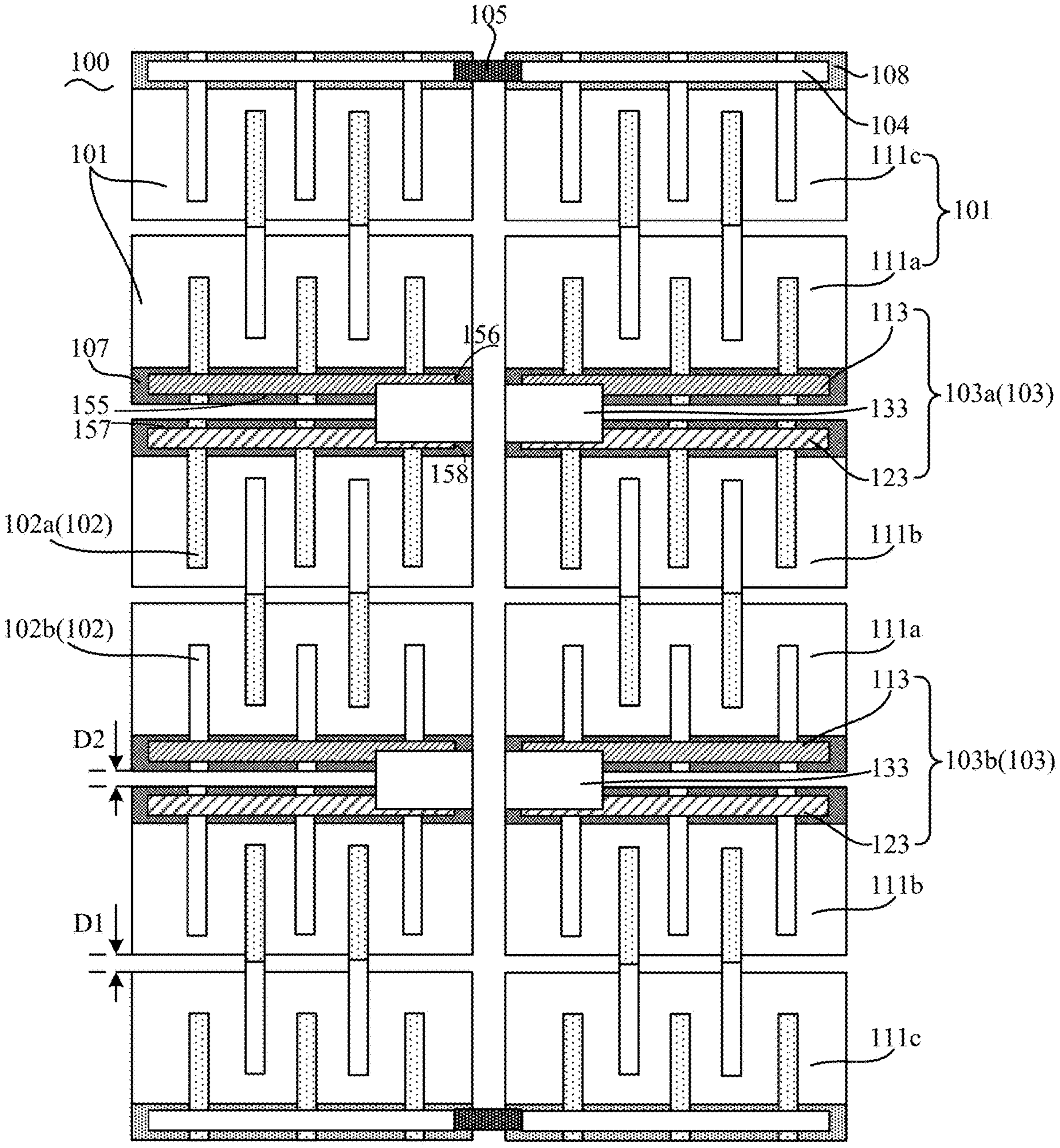
FIG. 6 is a second partial top view of a photovoltaic module according to an embodiment of the present disclosure.

FIG. 2 is a first partial top view of a photovoltaic module according to an embodiment of the present disclosure. FIG. 3 is a partial cross-sectional structural schematic view of the photovoltaic module shown in FIG. 2 along a first cross-sectional direction AA1. FIG. 4 is a partial cross-sectional structural schematic view of the photovoltaic module shown in FIG. 2 along the second cross-sectional direction BB1. FIG. 5 is a partial cross-sectional structural schematic view of the photovoltaic module shown in FIG. 2 along a third cross-sectional direction CC1. FIG. 6 is a second partial top view of a photovoltaic module according to an embodiment of the present disclosure. It shall be understood that FIG. 3 is a partial cross-sectional structural schematic view of the photovoltaic module shown in FIG. 6 along a first cross-sectional direction AA1. FIG. 4 is a partial cross-sectional structural schematic view of the photovoltaic module shown in FIG. 6 along the second cross-sectional direction BB1. FIG. 5 is a partial cross-sectional structural schematic view of the photovoltaic module shown in FIG. 6 along a third cross-sectional direction CC1.

It is to be noted that for adjacent cells 111 in the first direction X in a same cell string 101, some solder ribbon structures 102 that are directly facing each other in the first direction X each extend in an interval between the adjacent cells 111 to achieve electrical contact between two adjacent solder ribbon structures 102, thereby achieving electrical connection, for example, series connection, between the adjacent cells 111 in the first direction X in the same cell string 101. In this way, the two solder ribbon structures 102 electrically connected in the first direction X are electrically contacted with the electrodes 121 in different cells 111, and the two solder ribbon structures 102 electrically connected in the first direction X may be integrally formed. In other words, the two solder ribbon structures 102 electrically connected in the first direction X may constitute a long solder ribbon structure, and the long solder ribbon structure is used for electrical connection between adjacent cells 111 in the same cell string 101 in the first direction X. Based on this, for the first edge cell 111*a* or the second edge cell 111*b*, a partial number of solder ribbon structures 102 located thereon may be selected to have a shorter length than the long solder ribbon structures to achieve electrical connection between the first edge cell 111*a* or the second edge cell 111*b* and another cell 111 that belong to the same cell string 101. The remaining number of solder ribbon structures 102 on the first edge cell 111*a* or the second edge cell 111*b* are in electrical contact with the respective intermediate interconnection structure 103 to achieve electrical connection between the first edge cell 111*a* and the adjacent second edge cell 111*b* by means of the remaining number of solder ribbon structures 102 and the intermediate interconnection structure 103.

FIG. 2 illustrates two cell strings 101 spaced apart from each other in the first direction X by dashed boxes. It is to be noted that, in FIG. 2, only two cell strings 101 are spaced apart from each other in the first direction X and electrically connected in this order are taken as an example, and in FIG.

6, only three cell strings 101 are arranged at intervals in the first direction X and electrically connected in this order are taken as an example. However, in practical application, the number of cell strings 101 arranged at intervals in the first direction X and electrically connected in this order is not limited, for example, there may be 4, 5, or 6 cell strings 101.

In some cases, referring to FIG. 2, the photovoltaic module 100 includes two cell strings 101 separated in the first direction X and electrically connected in sequence, and thus, the photovoltaic module 100 has only one spacing between adjacent cell strings 101 in the first direction X. In this case, the intermediate interconnection structure 103 being not located at the end of the photovoltaic module 100 in the first direction X can also be regarded as that the intermediate interconnection structure 103 is located in the middle of the photovoltaic module 100 in the first direction X. In other cases, referring to FIG. 6, the photovoltaic module 100 includes three cell strings 101 arranged at intervals in the first direction X and electrically connected in sequence, and thus, the photovoltaic module 100 has two spacings between adjacent cell strings 101 along the first direction X. In this case, the intermediate interconnection structure 103 being not located at the end of the photovoltaic module 100 in the first direction X means that the intermediate interconnection structure 103 is located in either of the two spacings.

In embodiments of the present disclosure, a novel photovoltaic module 100 is provided, in particular, a structure for realizing electrical connection between adjacent cell strings 101 in the photovoltaic module 100 is provided. That is, the intermediate interconnection structure 103 including the first portion 113, the second portion 123, and the lead-out structure 133 is provided.

In this way, the first portion 113 of the intermediate interconnection structure 103 is designed to be in electrical contact with the at least two solder ribbon structures 102 disposed on the first edge cell 111*a* to collect current on the first edge cell 111*a* using the intermediate interconnection structure 103. In addition, the second portion 123 of the intermediate interconnection structure 103 is designed to be electrically connected with the at least two solder ribbon structures 102 disposed on the second edge cell 111*b*, so as to collect the current on the second edge cell 111*b* using the intermediate interconnection structure 103. Furthermore, the intermediate interconnection structure 103 is used as a whole to realize the electrical connection of two adjacent cell strings 101 in the first direction X. Specifically, the first edge cell 111*a* and the intermediate interconnection structure 103 are electrically connected by the first portion 113, and the second edge cell 111*b* and the intermediate interconnection structure 103 are electrically connected by the second portion 123, such that electrical connection between the first edge cell 111*a* and the second edge cell 111*b* can be achieved through the intermediate interconnection structure 103. that is, electrically connection, for example, series connection or parallel connection, between two adjacent cell strings 101 in the first direction X are achieved.

On the basis that two cell strings 101 adjacent in the first direction X are electrically connected by the intermediate interconnection structure 103, an orthographic projection of a partial region of the intermediate interconnection structure 103 on the reference plane and an orthographic projection of a corresponding cell 111 on the reference plane are designed to overlap. For example, the orthographic projection of the first portion 113 on the reference plane and the orthographic projection of the first edge cell 111*a* on the reference plane are designed to overlap, and the orthographic projection of the second portion 123 on the reference plane and the orthographic projection of the second edge cell 111*b* on the reference plane are designed to overlap. In other words, at least part of each of the first portion 113 and the second portion 123 is located on the corresponding cell 111 along the third direction Z, and there is no need to arrange the entire intermediate interconnection structure 103 in the spacing between the adjacent cell strings 101, so that it is beneficial to reduce the spacing between the adjacent cell strings 101 along the first direction X while satisfying the electrical function of the intermediate interconnection structure 103, so as to reduce the area occupied by the intermediate interconnection structure 103 in the photovoltaic module 100, thereby improving the arrangement density of the cell strings 101 in the photovoltaic module 100 to improve the efficiency of the photovoltaic module 100. Moreover, each of a plurality of solder ribbon structures 102 in electrical contact with the respective intermediate interconnection structure 103 does not need to extend into the spacing between adjacent cell strings 101, which is beneficial to reduce the material cost of preparing the solder ribbon structures 102.

It is to be noted that the orthographic projections of both the first portion 113 and the first edge cell 111*a* on the reference plane overlapping involves following two situations. In some cases, the orthographic projection of the first portion 113 on the reference plane is located in the orthographic projection of the first edge cell 111*a* on the reference plane. In other cases, an orthographic projection of a partial region of the first portion 113 on the reference plane is located in the orthographic projection of the first edge cell 111*a* on the reference plane, and a remaining region of the first portion 113 extends beyond the first edge cell 111*a* in the first direction X toward the second portion 123.

Furthermore, the orthographic projections of both the second portion 123 and the second edge cell 111*b* on the reference plane overlapping involves following two situations. In some cases, the orthographic projection of the second portion 123 on the reference plane is located in the orthographic projection of the second edge cell 111*b* on the reference plane. In other cases, an orthographic projection of a partial region of the second portion 123 on the reference plane is located in the orthographic projection of the second edge cell 111*b* on the reference plane, and a remaining region of the second portion 123 extends beyond the second edge cell 111*b* in the first direction X toward the first portion 113.

Hereinafter, embodiments of the present disclosure will be described in more detail with reference to the drawings.

In some embodiments, referring to FIGS. 4 to 6, there is a spacing D1 between each two adjacent cells 111 in the first direction X in the same cell string 101, and there is a pitch D2 between two adjacent cell strings 101 in the first direction X (i.e., the first edge cell 111*a* and the second edge cell 111*b* are spaced by a pitch D2 in the first direction X), where a ratio of the pitch D2 to the spacing D1 is in a range of 0.9 to 1.1, for example, the ratio of the pitch D2 to the spacing D1 may be 0.95, 1.0, or 1.05.

It is to be that for the same cell string 101, electrical connection between two adjacent cells 111 can be realized by means of a long solder ribbon structure, where the long solder ribbon structure can be a long strip structure extending along the first direction X. The long solder ribbon structure can pass through the spacing D1 along the first direction X, and there is no need to reserve space for the long solder ribbon structure when designing the spacing D1, such that the spacing D1 can be designed to be smaller.

In some cases, although the first portion 113 needs to extend in the second direction Y to electrically contact the at least two ribbon structures 102 disposed on the first edge cell 111*a* and the second portion 123 needs to extend in the second direction Y to electrically contact the at least two ribbon structures 102 disposed on the second edge cell 111*b*, the orthographic projections of both the first portion 113 and the first edge cell 111*a* on the reference plane are designed to overlap, and the orthographic projections of both the second portion 123 and the second edge cell 111*b* on the reference plane are designed to overlap. In this way, at least part of each of the first portion 113 and the second portion 123 are located on the corresponding cell 111 in the third direction Z. In other words, there is no need to arrange the first portion 113 and the second portion 123 in the pitch D2, which is beneficial to reduce the pitch D2 between adjacent cell strings 101 in the first direction X while satisfying the electrical function of the intermediate interconnection structure 103, so as to reduce the area occupied by the intermediate interconnection structure 103 in the photovoltaic module 100, so as to improve the arrangement density of the cell strings 101 in the photovoltaic module 100 to improve the efficiency of the photovoltaic module 100.

Moreover, based on the designed new intermediate interconnection structure 103, the ratio of the pitch D2 to the spacing D1 can be designed to be in the range of 0.9 to 1.1, that is, the spacing D1 and the pitch D2 can be designed to have a roughly same value, which is beneficial to improving the aesthetic appearance of the photovoltaic module 100 while improving the arrangement density of the cell strings 101 in the photovoltaic module 100.

In some examples, the spacing D1 may be in a range of 0.5 mm to 1 mm, for example, the spacing D1 may be in a range of 0.5 mm to 0.6 mm, 0.6 mm to 0.7 mm, 0.7 mm to 0.8 mm, 0.8 mm to 0.9 mm, or 0.9 mm to 1 mm. In one example, the spacing D1 may be 0.55 mm, 0.6 mm, 0.65 mm, 0.75 mm, 0.85 mm, 0.95 mm, or the like.

In some examples, the pitch D2 may also be in a range of 0.5 mm to 1 mm, for example, the pitch D2 may be in a range of 0.5 mm to 0.6 mm, 0.6 mm to 0.7 mm, 0.7 mm to 0.8 mm, 0.8 mm to 0.9 mm, or 0.9 mm to 1 mm. In one example, the pitch D2 may be 0.55 mm, 0.6 mm, 0.65 mm, 0.75 mm, 0.85 mm, 0.95 mm, or the like.

In some embodiments, referring to FIG. 2, each cell 111 may include a back contact solar cell (IBC), and the solder ribbon structures 102 and the intermediate interconnection structures 103 are all located on back surfaces of back contact solar cells, i.e., located on a back surface of the photovoltaic module 100.

It is to be noted that lower production cost and higher photoelectric conversion efficiency in the field of photovoltaic module technology are the main goal of the solar cell industry. Different from conventional solar cells, in the IBC cell, both positive and negative electrodes are placed on the back surface of the cell 111, thereby avoiding optical loss similar to the front surface of the conventional solar cell and improving the photoelectric conversion efficiency of the cell 111. Furthermore, in the photovoltaic module 100 designed according to embodiments of the present disclosure, a positional relationship between the respective intermediate interconnection structure 103 and the corresponding cell 111 is redesigned, so that the area occupied by the intermediate interconnection structure 103 in the photovoltaic module 100 can be reduced, for example, the pitch D2 between adjacent cell strings 101 in the first direction X can be reduced to improve the arrangement density of the cell strings 101 in the photovoltaic module 100.

It is to be noted that the back contact solar cell is an interdigitated back contact (IBC) cell. In FIGS. 2 to 6, the cell 111 is described as a back contact solar cell for illustration. In practical situations, the cell 111 can also be other types of cells, such as tunnel oxide passivated contact (TOPCON) cell, or passivated emitter and real cells (PERC cells). Solder ribbon structures of different polarities may be located on the front and back sides of the cells along the third direction, respectively, but based on the adjustment of the front and back sides of each cell, part region of the intermediate interconnection structure may still be located on the front or back sides of the cells.

In some examples, with reference to FIGS. 2 to 6, each electrode 121 in the back contact solar cell extends in the first direction X, and the electrode 121 may be a main busbar. The back contact solar cell may further include finger electrodes (not shown in the figure) each extending in the second direction Y, and the finger electrodes include finger electrodes of two polarities. The main busbars also include main busbars of two polarities, and a respective main busbar of the main busbars is used to collect the current on a plurality of fine electrodes with the same polarity as the respective main busbar.

In some embodiments, referring to FIGS. 2 to 7, FIG. 7 is a partial top view of an intermediate interconnection structure in a photovoltaic module according to an embodiment of the present disclosure. The first portion 113 and the second portion 123 are separated by a first distance D3 in the first direction X, and the lead-out structure 133 is in contact with at least part of a top surface of each of the first portion 113 and the second portion 123 away from a corresponding cell 111 in the third direction Z.

In this way, even if there is the first distance D3 between the first portion 113 and the second portion 123, the electrical connection between the first portion 113 and the second portion 123 can be realized by the lead-out structure 133, so that the electrical connection between the first edge cell 111*a* and the second edge cell 111*b* can be achieved as a whole through the intermediate interconnection structure 103 on the basis that the electrical connection between the first portion 113 and the at least two solder ribbon structures 102 disposed on the first edge cell 111*a* and the second portion 123 and the at least two solder ribbon structures 102 disposed on the second edge cell 111*b* can be realized. Furthermore, it is also advantageous to save the material required for preparing the intermediate interconnection structure 103 by means of the designed first distance D3, so as to reduce the material cost for preparing the intermediate interconnection structure 103.

On the basis that there is the first distance D3 between the first portion 113 and the second portion 123, a positional relationship between the lead-out structure 133 and the first portion 113 and the second portion 123 will be described in detail below.

Figure 8:
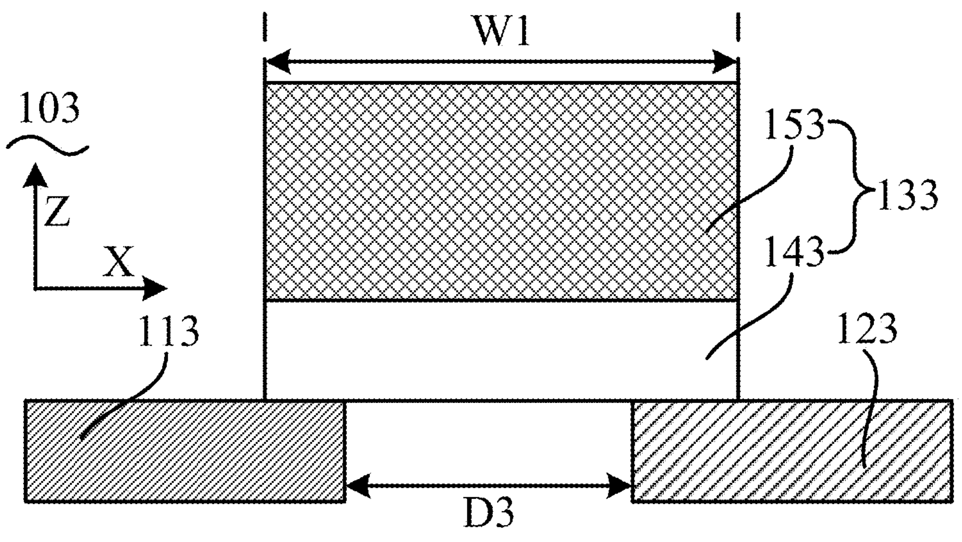
FIG. 8 is a partial cross-sectional view of an intermediate interconnection structure in a photovoltaic module according to an embodiment of the present disclosure.

In some cases, referring to FIG. 8, which is a partial cross-sectional view of an intermediate interconnection structure in a photovoltaic module according to an embodiment of the present disclosure, the lead-out structure 133 is only in contact with part of the top surface of each of the first portion 113 and the second portion 123 away from the corresponding cell 111 in the third direction Z.

Figure 9:
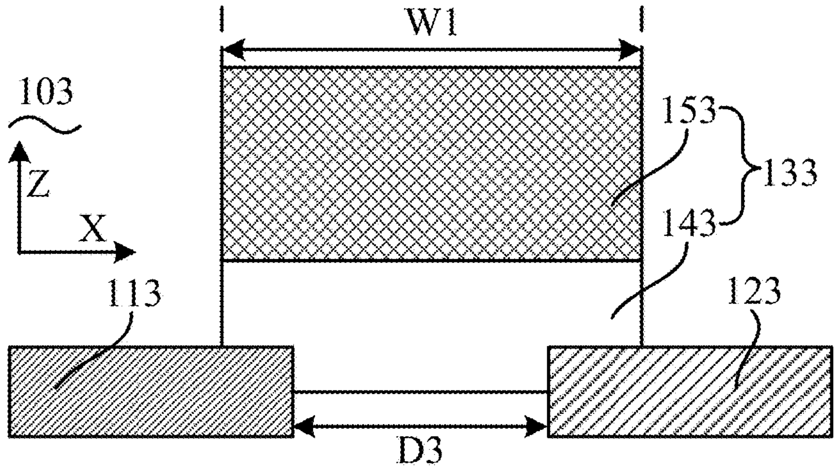
FIG. 9 is another partial cross-sectional view of an intermediate interconnection structure in a photovoltaic module according to an embodiment of the present disclosure.

In other cases, referring to FIG. 9, which is another partial cross-sectional view of an intermediate interconnection structure in a photovoltaic module according to an embodiment of the present disclosure, on the basis that the lead-out structure 133 is in contact with part of the top surface of each of the first portion 113 and the second portion 123 away from the corresponding cell 111 in the third direction Z, the lead-out structure 133 is further in contact with at least part of each of at least one side surface, extending in the third direction Z, of each of at least one of the first portion 113 and the second portion 123.

It is to be noted that FIG. 9 shows that the lead-out structure 133 is in contact with part of the side surface of each of the first portion 113 and the second portion 123 extending in the third direction Z. However, in a practical situation, the lead-out structure may be only in contact with part of the side surface of the first portion extending in the third direction, or the lead-out structure may be only in contact with part of the side surface of the second portion extending in the third direction.

It is to be noted that, on the basis that the lead-out structure 133 is in contact with the part of the top surface of the first portion 113 away from the corresponding cell 111 in the third direction Z, the lead-out structure 133 is further in contact with at least part of the side surface of the first portion 113 extending in the third direction Z, which is beneficial to increase a contact area between the lead-out structure 133 and the first portion 113, thereby improving electrical contact performance between the lead-out structure 133 and the first portion 113 and improving the collection efficiency of the current on the cell string 101 by the intermediate interconnection structure 103.

Similarly, on the basis that the lead-out structure 133 is in contact with the part of the top surface of the second portion 123 away from the corresponding cell 111 in the third direction Z, the lead-out structure 133 is further in contact with at least part of the side surface of the second portion 123 extending in the third direction Z, which is beneficial to increase a contact area between the lead-out structure 133 and the second portion 123, thereby improving the electrical contact performance between the lead-out structure 133 and the second portion 123 and improving the collection efficiency of the current on the cell string 101 by the intermediate interconnection structure 103.

Hereinafter, the following describes a situation where the lead-out structure 133 is in contact with the part of the side surface of the first portion 113 extending in the third direction Z in detail.

Figure 7:
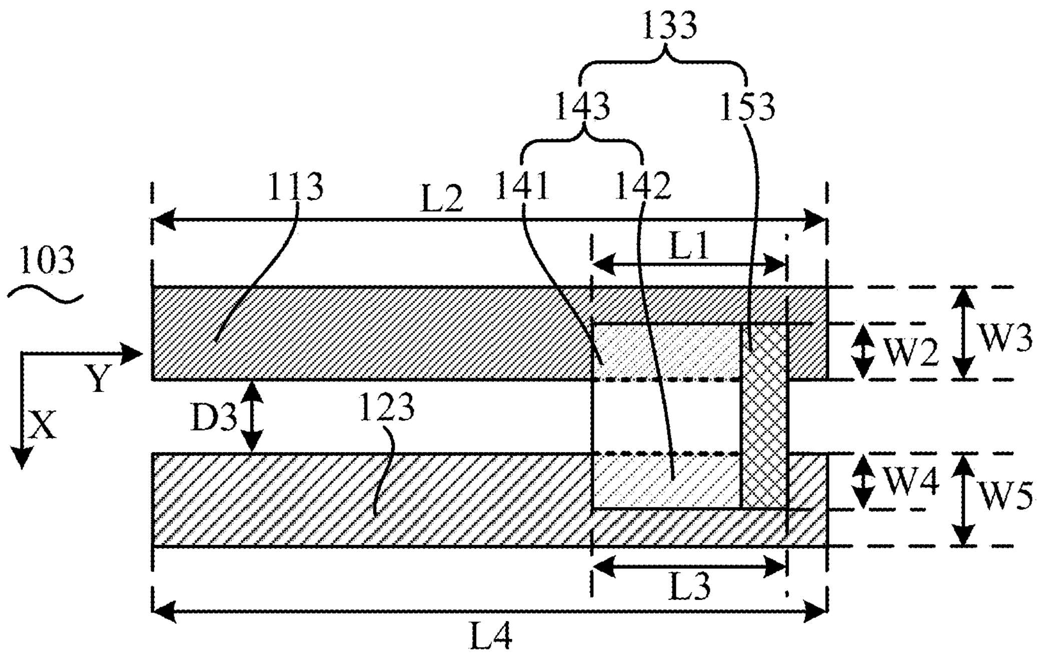
FIG. 7 is a partial top view of an intermediate interconnection structure in a photovoltaic module according to an embodiment of the present disclosure.

In some examples, in conjunction with FIGS. 7 and 9, the first portion 113 includes a first side surface 155 adjacent to the second portion 123 in the first direction X. The lead-out structure 133 is only in contact with at least part of the first side surface.

In other examples, in conjunction with FIGS. 2 and 9, the first portion 113 includes the first side surface 155 adjacent to the second portion 123 in the first direction X, and a second side surface 156 adjacent to another first portion 113 in the second direction Y. The lead-out structure 133 is in contact not only with at least a partial region of the first side surface but also with at least a partial region of the second side surface. In this way, it is advantageous to further increase the contact area between the lead-out structure 133 and the first portion 113, so as to improve the electrical contact performance between the lead-out structure 133 and the first portion 113.

Hereinafter, the following describes a situation where the lead-out structure 133 is in contact with the part of the side surface of the second portion 123 extending in the third direction Z in detail.

In some examples, in conjunction with FIGS. 7 and 9, the second portion 123 includes a third side surface 157 adjacent to the first portion 113 in the first direction X. The lead-out structure 133 is only in contact with at least part of the third side surface.

In other examples, in conjunction with FIGS. 2 and 9, the second portion 123 includes a third side surface 157 adjacent to the first portion 113 in the first direction X, and a fourth side surface 158 adjacent to another second portion 123 in the second direction Y. The lead-out structure 133 is in contact not only with at least a partial region of the third side surface but also with at least a partial region of the fourth side surface. In this way, it is advantageous to further increase the contact area between the lead-out structure 133 and the second portion 123, so as to improve the electrical contact performance between the lead-out structure 133 and the second portion 123.

In some embodiments, referring to FIG. 8 or FIG. 9, on the basis of having the first distance D3 between the first portion 113 and the second portion 123, the lead-out structure 133 may include a contact portion 143 and a lead-out portion 153 that are connected with each other in the third direction Z. The contact portion 143 is in contact with both the first portion 113 and the second portion 123, and the lead-out portion 153 is located on a side of the contact portion 143 away from the corresponding cell 111 in the third direction Z. A width of the contact portion 143 in the first direction X is a first width W1, and the first width W1 is larger than the first distance D3.

The ways in which the contact portion 143 is in contact with the first portion 113 and the second portion 123 can be any of those in the above-mentioned embodiments.

In addition, the first width W1 is larger than the first distance D3, which is advantageous to ensure that the contact portion 143 is in contact with part of the top surface of each of the first portion 113 and the second portion 123 away from the corresponding cell 111 in the third direction Z. Therefore, on the basis that there is the first distance D3 between the first portion 113 and the second portion 123, the electrical connection of the first portion 113 and the second portion 123 can be realized by the lead-out structure 133. Furthermore, since the first width W1 of the contact portion 143 is large, it is advantageous to increase the cross-sectional area of the contact portion 143 to improve the conductivity of the contact portion 143.

In some embodiments, referring to FIG. 7, the contact portion 143 may include a first sub-contact portion 141 and a second sub-contact portion 142. The first sub-contact portion 141 faces the first portion 113 in the third direction Z, and the second sub-contact portion 142 faces the second portion 123 in the third direction Z. In the first direction X, a width of the first sub-contact portion 141 is a second width W2, a width of the first portion 113 is a third width W3, and a ratio of the second width W2 to the third width W3 is greater than or equal to 0.4; and/or in the first direction X, a width of the second sub-contact portion 142 is a fourth width W4, a width of the second portion 123 is a fifth width W5, and a ratio of the fourth width W4 to the fifth width W5 is greater than or equal to 0.4.

It shall be noted that the first sub-contact portion 141 facing the first portion 113 in the third direction Z refers to that an orthographic projection of the first sub-contact portion 141 on the reference plane is located within an orthographic projection of the first portion 113 on the reference plane. The second sub-contact portion 142 facing the second portion 123 in the third direction Z refers to that an orthographic projection of the second sub-contact portion 142 on the reference plane is located within the orthographic projection of the second portion 123 on the reference plane.

In addition, in FIG. 7, the first sub-contact portion 141 and the second sub-contact portion 142 in the contact portion 143 are divided by a thick dashed line, and in order to clearly illustrate the positional relationship between the lead-out structure 133 and the first portion 113 and the second portion 123, the contact portion 143 is shown in a perspective manner in FIG. 7.

It shall be noted that, in some cases, the ratio of the second width W2 to the third width W3 is designed to be greater than or equal to 0.4, and the ratio of the fourth width W4 to the fifth width W5 is designed to be greater than or equal to 0.4. The ratio of the second width W2 to the third width W3 is greater than or equal to 0.4, which is beneficial to make the contact area between the contact portion 143 and the top surface of the first portion 113, that is, the contact area between the first sub-contact portion 141 and the first portion 113, not too small, so as to improve the contact performance between the contact portion 143 and the first portion 113. The ratio of the fourth width W4 to the fifth width W5 is greater than or equal to 0.4, so that the contact area between the contact portion 143 and the top surface of the second portion 123, that is, the contact area between the second sub-contact portion 142 and the second portion 123, is not too small, so as to improve the contact performance between the contact portion 143 and the second portion 123.

In other cases, only the ratio of the second width W2 to the third width W3 may be designed to be greater than or equal to 0.4, and the ratio of the fourth width W4 to the fifth width W5 may not be limited.

In some cases, only the ratio of the fourth width W4 to the fifth width W5 may be designed to be greater than or equal to 0.4, and the ratio of the second width W2 to the third width W3 may not be limited.

In some examples, the ratio of the second width W2 to the third width W3 is greater than or equal to 0.4, for example, the ratio of the second width W2 to the third width W3 is in a range of 0.4 to 0.45, 0.45 to 0.5, 0.5 to 0.55, 0.55 to 0.6, 0.6 to 0.65, or 0.65 to 0.7. In one example, the ratio of the second width W2 to the third width W3 may be 0.42, 0.48, 0.53, 0.56, 0.62, 0.66, or the like.

In some examples, the ratio of the fourth width W4 to the fifth width W5 is greater than or equal to 0.4, for example, the ratio of the fourth width W4 to the fifth width W5 is in a range of 0.4 to 0.45, 0.45 to 0.5, 0.5 to 0.55, 0.55 to 0.6, 0.6 to 0.65, or 0.65 to 0.7. In one example, the ratio of the fourth width W4 to the fifth width W5 may be 0.42, 0.48, 0.53, 0.56, 0.62, 0.66, or the like.

In some examples, the second width W2 may be equal to the fourth width W4, and/or the third width W3 may be equal to the fifth width W5.

In some examples, with continued reference to FIG. 7, in the first direction X, the first width W1 may be greater than or equal to 2 mm, for example, the first width W1 may be 2 mm, 2.5 mm, 3 mm, 3.5 mm, 4 mm, or the like.

In some embodiments, with continued reference to FIG. 7, the contact portion 143 may include a first sub-contact portion 141 and a second sub-contact portion 142. The first sub-contact portion 141 faces the first portion 113 in the third direction Z, and the second sub-contact portion 142 faces the second portion 123 in the third direction Z. In the second direction Y, a length of the first sub-contact portion 141 is a first length L1, a length of the first portion 113 is a second length L2, and a ratio of the first length L1 to the second length L2 is less than or equal to $\frac{1}{3}$; and/or, in the second direction Y, a length of the second sub-contact portion 142 is a third length L3, a length of the second portion 123 is a fourth length L4, and a ratio of the third length L3 to the fourth length L4 is less than or equal to $\frac{1}{3}$.

It shall be noted that, in some cases, the ratio of the first length L1 to the second length L2 is designed to be less than or equal to $\frac{1}{3}$, and the ratio of the third length L3 to the fourth length L4 is designed to be less than or equal to $\frac{1}{3}$. The ratio of the first length L1 to the second length L2 is less than or equal to $\frac{1}{3}$, which is beneficial to make the contact area between the contact portion 143 and the top surface of the first portion 113, that is, the contact area between the first sub-contact portion 141 and the first portion 113, not too small, so as to control the cross-sectional area of the first sub-contact portion 141 from being too large. Thus, while improving the contact performance between the contact portion 143 and the first portion 113, the material cost of the first sub-contact portion 141 can be controlled at a reasonable level. The ratio of the third length L3 to the fourth length L4 is designed to be less than or equal to $\frac{1}{3}$, so that the contact area between the contact portion 143 and the top surface of the second portion 123, that is, the contact area between the second sub-contact portion 142 and the second portion 123, is not too small, so as to control the cross-sectional area of the second sub-contact portion 142 from being too large. Thus, while improving the contact performance between the contact portion 143 and the second portion 123, the material cost of the second sub-contact portion 142 can be controlled at a reasonable level.

In other cases, only the ratio of the first length L1 to the second length L2 may be designed to be less than or equal to $\frac{1}{3}$, and the ratio of the third length L3 to the fourth length L4 may not be limited.

In other cases, only the ratio of the third length L3 to the fourth length L4 may be designed to be less than or equal to $\frac{1}{3}$, and the ratio of the first length L1 to the second length L2 may not be limited.

In some embodiments, the first length L1 may be equal to the third length L3, and the first sub-contact portion 141 and the second sub-contact portion 142 may be integrally formed.

In some examples, the ratio of the first length L1 to the second length L2 is less than or equal to $\frac{1}{3}$, for example, the ratio of the first length L1 to the second length L2 is in a range of $\frac{1}{4}$ to $\frac{1}{3}$, $\frac{1}{5}$ to $\frac{1}{4}$, or $\frac{1}{6}$ to $\frac{1}{5}$. In one example, the ratio of the first length L1 to the second length L2 may be $\frac{7}{24}$, $\frac{9}{40}$, $\frac{11}{60}$, or the like.

In some examples, the ratio of the third length L3 to the fourth length L4 is less than or equal to $\frac{1}{3}$, for example, the ratio of the third length L3 to the fourth length L4 is in a range of $\frac{1}{4}$ to $\frac{1}{3}$, $\frac{1}{5}$ to $\frac{1}{4}$, or $\frac{1}{6}$ to $\frac{1}{5}$. In one example, the ratio of the third length L3 to the fourth length L4 may be $\frac{7}{24}$, $\frac{9}{40}$, $\frac{11}{60}$, etc.

Figure 10:
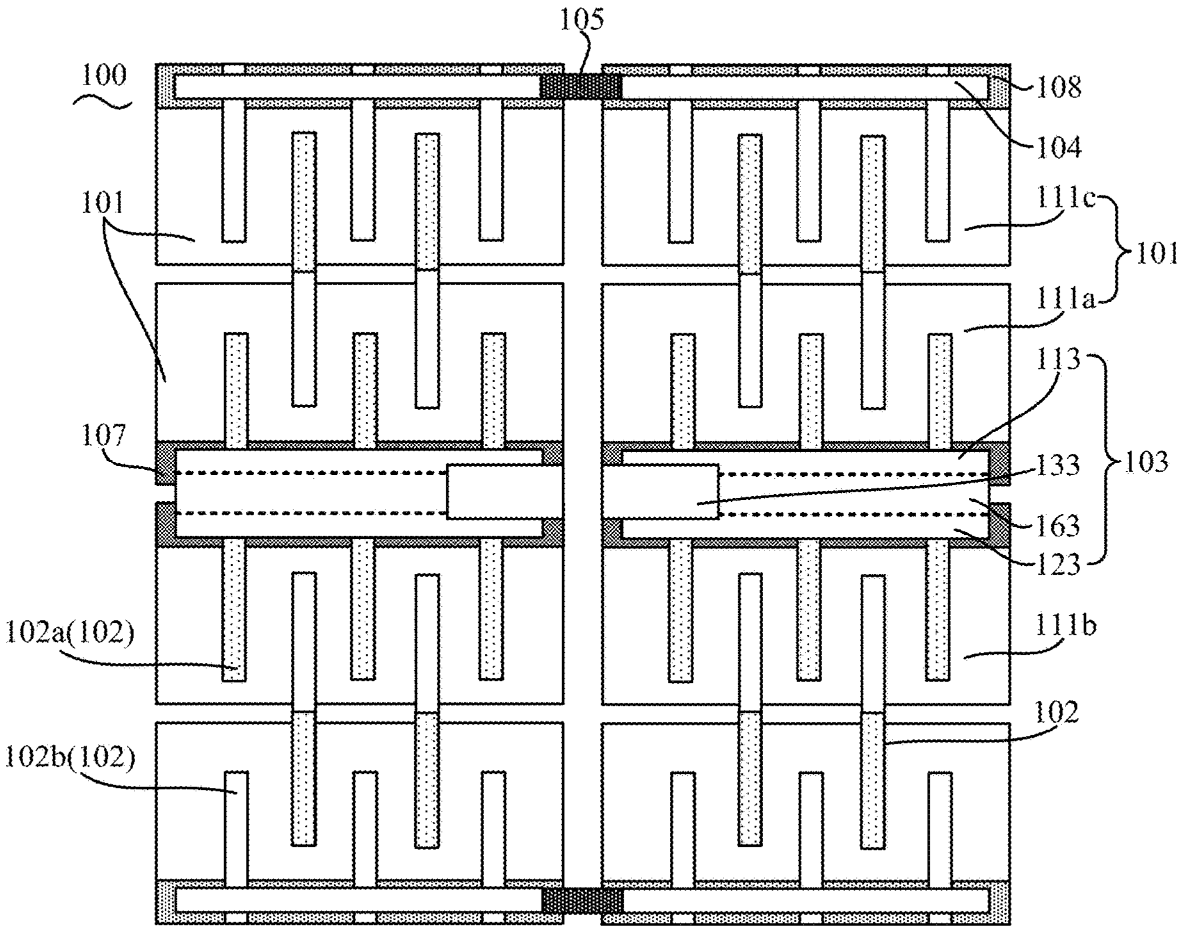
FIG. 10 is a third partial top view of a photovoltaic module according to an embodiment of the present disclosure.
Figure 11:
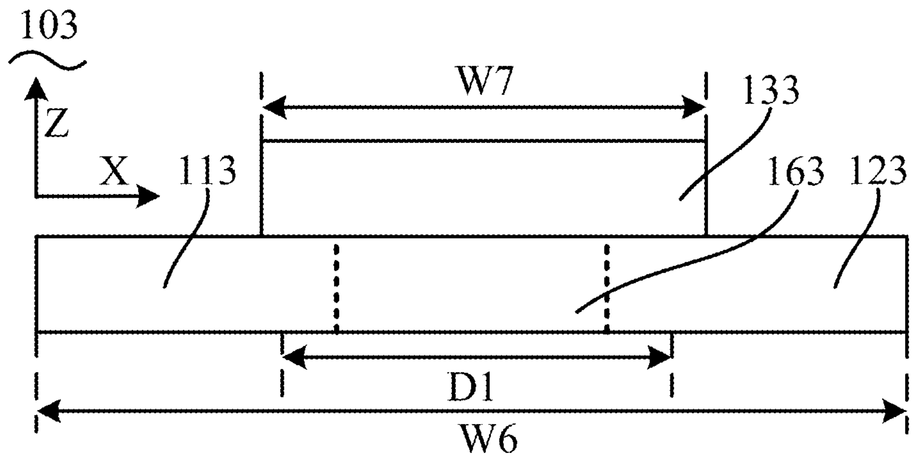
FIG. 11 is a partial cross-sectional structural schematic view of an intermediate interconnection structure in the photovoltaic module shown in FIG. 10.

In other embodiments, referring to FIG. 10, which is a third partial top view of a photovoltaic module according to an embodiment of the present disclosure. The respective intermediate interconnection structure 103 may further include a third portion 163. The third portion 163 is located between the first portion 113 and the second portion 123, and the third portion 163 is in contact with both the first portion 113 and the second portion 123. Referring to FIGS. 10 and 11, where FIG. 11 is a partial cross-sectional structural schematic view of an intermediate interconnection structure in the photovoltaic module shown in FIG. 10. There is a spacing D1 between each two adjacent cells 111 in a same cell string 101 in the first direction X. In the first direction X, a sixth width W6 of the respective intermediate interconnection structure 103 is larger than the spacing D1. The lead-out structure 133 is in contact with at least part of a top surface of the respective intermediate interconnection structure 103 away from the corresponding cell 111 in the third direction Z, i.e., the lead-out structure 133 is in contact with at least part of a top surface of the third portion 163 away from the corresponding cell 111 in the third direction Z.

It shall be noted that in FIGS. 10 and 11, the first portion 113, the second portion 123, and the third portion 163 of the respective intermediate interconnection structure 103 are schematically illustrated by thick dashed lines.

In some instances, the first portion 113, the second portion 123, and the third portion 163 may be integrally formed.

In some cases, on the basis that the intermediate interconnection structure 103 includes the first portion 113, the second portion 123, and the third portion 163, the lead-out structure 133 may include the contact portion 143 and the lead-out portion 153 that are connected with each other, where the contact portion 143 is connected with at least one of the first portion 113, the second portion 123, and the third portion 163, and the lead-out portion 153 is located on a side of the contact portion 143 away from the corresponding cell 111 in the third direction Z.

It shall be noted that the lead-out structure 133 may be in contact with a top surface of each of at least one of the first portion 113, the second portion 123, and the third portion 163 in the third direction Z. In FIG. 11, the lead-out structure 133 is shown to be in contact with the top surface of each of the first portion 113, the second portion 123, and the third portion 163 in the third direction Z. However, in practical situations, the lead-out structure may be connected in contact with the top surface of the first portion, the second portion, or the third portion in the third direction, or the lead-out structure may be connected in contact with the top surface of each of the second portion and the third portion in the third direction, or the lead-out structure may be connected in contact with the top surface of each of the first portion and the third portion in the third direction.

In some embodiments, referring to FIG. 11, a width of the lead-out structure 133 in the first direction X is a seventh width W7, and the seventh width W7 is less than or equal to the sixth width W6. In this way, it is advantageous to improve the contact performance between the lead-out structure 133 and the first portion 113 and the second portion 123, and control the material cost of the lead-out structure 133 from being too high.

Figure 12:
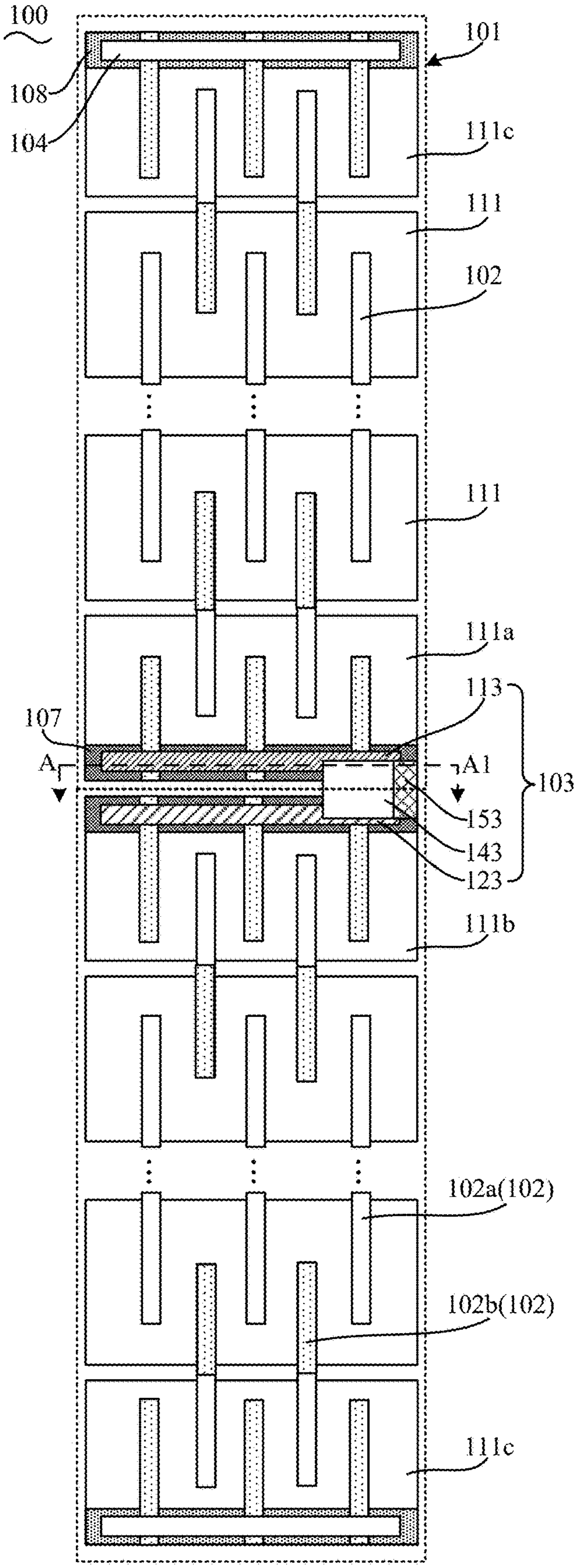
FIG. 12 is a fourth partial top view of a photovoltaic module according to an embodiment of the present disclosure.

In some embodiments, referring to FIG. 6, FIG. 10, or FIG. 12, FIG. 12 is a fourth partial top view of a photovoltaic module according to an embodiment of the present disclosure. The photovoltaic module 100 has a plurality of peripheral cells 111*c* respectively located at both ends of the photovoltaic module in the first direction X. The photovoltaic module 100 may further include a plurality of peripheral interconnection structures 104. An orthographic projection of each respective peripheral interconnection structure 104 of the plurality of peripheral interconnection structures 104 and an orthographic projection of a respective peripheral cell 111*c* on the reference plane overlap. The respective peripheral interconnection structure 104 is in electrical contact with at least two solder ribbon structures 102 located on the respective peripheral cell 111*c* of which orthographic projection on the reference plane overlaps that of the respective peripheral interconnection structure 104 on the reference plane.

It is to be noted that, regardless of the number of a plurality of cell strings 101 arranged at intervals in the first direction X and electrically connected sequentially in the photovoltaic module 100, the plurality of cell strings 101 arranged at intervals in the first direction X and electrically connected sequentially can be regarded as a cell string column. The cell string column has one peripheral cell 111*c* at each of both ends in the first direction X. The plurality of peripheral cells 111*c* and the plurality of peripheral interconnection structures 104 are in one-to-one correspondence.

In addition, only three cells 111 in a single cell string 101 are schematically shown in FIG. 2. In FIGS. 6 and 10, a single cell string 101 only schematically includes two cells 111 arranged at intervals in the first direction X and electrically connected in sequence. In FIG. 12, only four cells 111 in a single cell string 101 are illustrated. In practical situations, there is no restriction on the number of cells 111 included in a single cell string 101 arranged at intervals in the first direction X and electrically connected in this order, and for example, the single cell string 101 may include 5 cells 111, 6 cells 111, 7 cells 111, 8 cells 111, or the like.

It shall be noted that the orthographic projection of each respective peripheral interconnection structure 104 and the orthographic projection of the respective peripheral cell 111*c* on the reference plane overlapping involves following situations. The orthographic projection of the respective peripheral interconnection structure 104 on the reference plane is located within the orthographic projection of the respective peripheral cell 111*c* on the reference plane, so as to prevent the peripheral interconnection structure 104 from occupying an additional layout area in the photovoltaic module 100, so as to further improve the arrangement density of the cell strings 101 in the photovoltaic module 100, to improve the efficiency of the photovoltaic module 100.

In some cases, the respective peripheral interconnection structure 104 is in electrical contact with the at least two solder ribbon structures 102 disposed on the respective peripheral cell 111*c*. Each peripheral interconnection structure 104 is a long strip-shaped structure extending in the second direction Y.

In some embodiments, referring to FIG. 6 or FIG. 10, at least two cell strings 101 are arranged at intervals along the second direction Y. The photovoltaic module 100 may further include connection structures 105, where a respective connection structure 105 is in electrical contact with a corresponding pair of adjacent peripheral interconnection structures 104 along the second direction Y.

It shall be noted that, a single peripheral interconnection structure 104 is used to collect current on the corresponding peripheral cell 111*c*. The plurality of cell strings 101 arranged at intervals in the first direction X and electrically connected sequentially are regarded as a cell string column, and electrical connection, for example, series or parallel connection, between two adjacent peripheral interconnection structures 104 on two adjacent cell string columns in the second direction Y are achieved by means of a corresponding connection structure 105.

In some cases, the two adjacent peripheral interconnection structures 104 arranged at intervals along the second direction Y and the corresponding connection structure 105 located between the two adjacent peripheral interconnection structures 104 are integrally formed, which is beneficial to simplify the manufacturing process of the photovoltaic module and reduce the manufacturing cost of the photovoltaic module.

In some embodiments, referring to FIG. 2, FIG. 6, FIG. 10, or FIG. 12, the photovoltaic module 100 may further include a junction box, where the junction box is electrically connected to an end of the lead-out structure 133 away from the intermediate interconnection structure 103 in the third direction Z.

Figure 13:
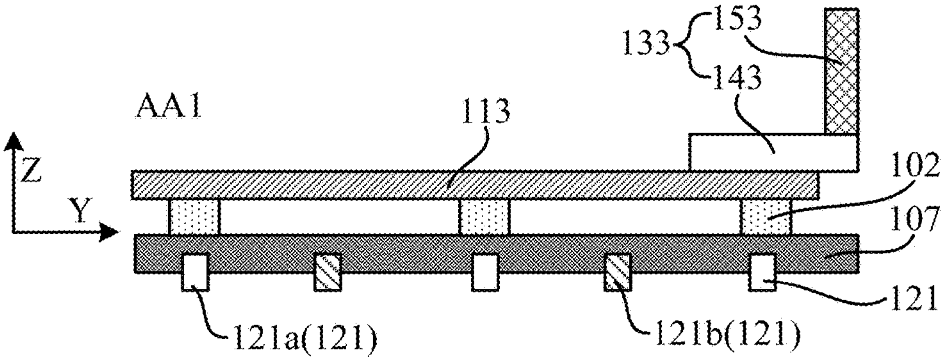
FIG. 13 is a schematic view of a partial cross-sectional structure of the photovoltaic module shown in FIG. 12 along a first cross-sectional direction AA1.

In some cases, referring to FIG. 13, which is a schematic view of a partial cross-sectional structure of the photovoltaic module shown in FIG. 12 along a first cross-sectional direction AA1. In the third direction Z, the lead-out structure 133 includes a contact portion 143 and a lead-out portion 153 that are connected with each other. The contact portion 143 is in contact with both the first portion 113 and the second portion 123, and the lead-out portion 153 is located on a side of the contact portion 143 away from a corresponding cell 111 in the third direction Z. Furthermore, a length of the contact portion 143 in the second direction Y is larger than a length of the lead-out portion 153 in the second direction Y. A cross-sectional shape of the entire lead-out structure 133 in a cross section perpendicular to the first direction is L-shaped. The junction box and the lead-out portion 153 are electrically connected with each other.

In some cases, referring to FIG. 6 or FIG. 10, the photovoltaic module 100 may include at least two cell strings 101 arranged at intervals in the second direction Y. Two adjacent cell strings 101 in the second direction Y are electrically connected to two different intermediate interconnection structures 103, respectively. The two intermediate interconnection structures 103 are adjacent in the second direction Y, and the two intermediate interconnection structures 103 adjacent in the second direction Y are electrically connected to a same junction box. In some embodiments, the lead-out structure 133 includes the contact portion 143 and the lead-out portion 153 that are in contact with each other. Two lead-out portions 153 of the two intermediate interconnection structures 103 adjacent in the second direction Y are also adjacent in the second direction Y. For example, the two adjacent intermediate interconnection structures 103 in the second direction Y are approximately axisymmetric along the gap between the two adjacent intermediate interconnection structures 103.

In some embodiments, referring to FIGS. 3 to 5, and FIG. 13, the plurality of electrodes 121 may include first electrodes 121*a* and second electrodes 121*b* spaced apart and alternatingly arranged in the second direction Y. The first electrodes 121*a* and the second electrodes 121*b* have different polarities. Referring to FIGS. 2, 6, 10, and 12, the solder ribbon structures 102 include first solder ribbon structures 102*a* and second solder ribbon structures 102*b*. Each respective first solder ribbon structure 102*a* of the first solder ribbon structures 102*a* is in electrical contact with a corresponding first electrode 121*a* of the electrodes 121 of the corresponding cell 111, and each respective second solder ribbon structure 102*b* of the second solder ribbon structures 102*b* is in electrical contact with a corresponding second electrode 121*b* of the electrodes 121 of the corresponding cell 111. Referring to FIG. 6, the intermediate interconnection structures 103 include first intermediate interconnection structures 103*a* and second intermediate interconnection structures 103*b*. Each of the first intermediate interconnection structures 103*a* is in electrical contact with at least two first solder ribbon structures 102*a* disposed on a corresponding pair of cells 111 and each of the second intermediate interconnection structures 103*b* is in electrical contact with at least two second solder ribbon structures 102*b* disposed on a corresponding pair of cells 111. With reference to FIGS. 3 and 6, the photovoltaic module 100 may further include insulating structures 107 located at least between the first intermediate interconnection structures 103*a* and second electrodes 121*b* of corresponding cells 111, and between the second intermediate interconnection structures 103*b* and first electrodes 121*a* of corresponding cells 111.

In some cases where the cell 111 is an IBC cell, all the plurality of electrodes 121 are located on the back surface of the cell 111 in the third direction Z. In other words, the first electrodes 121*a* and the second electrodes 121*b* are located on the back surface of the cell 111 in the third direction Z. In other cases, the first electrodes may be located on one of the front surface and the back surface of the cell in the third direction, and the second electrodes may be located on the other of the front surface and the back surface of the cell in the third direction.

Hereinafter, the insulating structure 107 will be described in detail by taking the cell 111 as an IBC cell as an example.

In some examples, in conjunction with FIGS. 3 and 6, the first electrodes 121*a* and the second electrodes 121*b* are both located on the back surface of the cell 111, and the first solder ribbon structures 102*a* and the second solder ribbon structures 102*b* are also located on the back surface of the cells 111. Each cell 111 has a first edge region (not labeled in the figure) and a second edge region (not labeled in the figure) that are opposite to each other in the first direction X. In order for the intermediate interconnection structure 103 to be in electrical contact with only the at least two first solder ribbon structures 102*a* or the at least two second solder ribbon structures 102*b*, the at least two first solder ribbon structures 102*a* each extend to the first edge region and the at least two second solder ribbon structures 102*b* each extend to the second edge region.

Based on this, the respective first solder ribbon structure 102*a* in electrical contact with the corresponding first electrode 121*a* does not completely cover the corresponding first electrode 121*a*, for example, the corresponding first electrode 121*a* is further located on the first edge region or the second edge region of the cell 111 on which no first solder ribbon structure 102*a* is provided. Alternatively, the respective second solder ribbon structure 102*b* in electrical contact with the corresponding second electrode 121*b* does not completely cover the second electrode 121*b*, for example, the corresponding second electrode 121*b* is further located on the first edge region or the second edge region of the cell 111 on which no second solder ribbon structure 102*b* is provided. Therefore, in order to ensure electrical contact between each first intermediate interconnection structure 103*a* and the at least two first solder ribbon structures 102*a* of the corresponding pair of cells 111, and avoid electrical contact between the first intermediate interconnection structure 103*a* and a region where a plurality of second electrodes 121*b* of the corresponding pair of cells 111 are not covered by corresponding second solder ribbon structures 102*b*, an insulating structure 107 is provided between the first intermediate interconnection structure 103*a* and the plurality of second electrodes 121*b* of the corresponding pair of cells 111 to ensure electrical insulation between the first intermediate interconnection structure 103*a* and the plurality of second electrodes 121*b* of the corresponding pair of cells 111. Similarly, in order to ensure electrical contact between each second intermediate interconnection structure 103*b* and the at least two second solder ribbon structures 102*b* of corresponding pair of cells 111, and avoid electrical contact between the second intermediate interconnection structure 103*b* and a region where a plurality of first electrodes 121*a* of the corresponding pair of cells 111 are not covered by corresponding first solder ribbon structures 102*a*, an insulating structure 107 is provided between the second intermediate interconnection structure 103*b* and the plurality of first electrodes 121*a* of the corresponding pair of cells 111 to ensure electrical insulation between the second intermediate interconnection structure 103*b* and the plurality of first electrodes 121*a* of the corresponding pair of cells 111.

It is to be noted that, in the embodiments shown in FIGS. 2, 6, 10, and 12, each intermediate interconnection structure 103 that realizes the electrical connection of two adjacent cell strings 101 in the first direction X is only one of the first intermediate interconnection structure 103*a* and the second intermediate interconnection structure 103*b*, so that the at least two solder ribbon structures 102 of the same polarity in the first edge cell 111*a* and the second edge cell 111*b* in the two adjacent cell strings 101 in the first direction X are electrically connected to the same intermediate interconnection structure 103, to realize parallel connection of two adjacent cell strings 101 in the first direction X.

In practical application, the electrodes include the first electrodes and the second electrodes spaced and alternatingly arranged in the second direction, and the polarities of the first electrodes and the second electrodes are different. The solder ribbon structures include the first solder ribbon structures and the second solder ribbon structures. Each respective first solder ribbon structure is in electrical contact with a corresponding first electrode of the electrodes 121 of the corresponding cell 11, and each respective second solder ribbon structure is in electrical contact with a corresponding second electrode of the electrodes 121 of the corresponding cell. For any intermediate interconnection structure that realizes the electrical connection of two adjacent cell strings in the first direction, the intermediate interconnection structure may realize the electrical connection between the first solder ribbon structures on the first edge cell and the second solder ribbon structures on the second edge cell, or realize the electrical connection between the second solder ribbon structures on the first edge cell and the first solder ribbon structures on the second edge cell, so that the solder ribbon structures of different polarities in the first edge cell and the adjacent second edge cell in the first direction are electrically connected to the same intermediate interconnection structure to realize series connection of the two adjacent cell strings in the first direction.

In other words, it is possible to select whether the intermediate interconnection structure realizes parallel operation or series operation for the first edge cell and the adjacent second edge cell in the first direction according to the actual application.

Hereinafter, the intermediate interconnection structure 103 and the insulating structure 107 will be described in detail.

In some embodiments, referring to FIG. 4, each of a plurality of solder ribbon structures 102 in electrical contact with the respective intermediate interconnection structure 103 may include a first segment 112, a third segment 132, and a second segment 122 that contacts and connects the first segment 112 and the third segment 132. The first segment 112 is in the same layer as at least a portion of a corresponding insulating structure 107 of the insulating structures 107 (e.g., the first segment 112 is substantially flush with the at least the portion of the corresponding insulating structure 107). The third segment 132 is located on a side of the corresponding insulating structure 107 away from the corresponding electrode 121 in the third direction Z, and the third segment 132 is located between the corresponding insulating structure 107 and the respective intermediate interconnection structure 103. An orthographic projection of the first portion 113 on the reference plane is located in the orthographic projection of the corresponding insulating structure 107 on the reference plane, and an orthographic projection of the second portion 123 on the reference plane is located in the orthographic projection of the corresponding insulating structure 107 on the reference plane.

It is to be noted that with reference to FIGS. 3 and 4, the insulating structures 107 is provided on each first edge cell 111*a* and each second edge cell 111*b*. In order to realize electrical connection between the intermediate interconnection structure 103 and all the first solder ribbon structures 102*a* on the same cell 111, or to realize electrical connection between the intermediate interconnection structure 103 and all the second solder ribbon structures 102*b* on the same cell 111, the intermediate interconnection structure 103 extending in the second direction Y may not only be in electrical contact with the plurality of solder ribbon structures 102 with the same polarity, but also be in contact with the insulating structure 107. Thus, providing the orthographic projection of the first portion 113 on the reference plane to be located in the orthographic projection of the insulating structure 107 on the reference plane is advantageous in ensuring that the insulating structure 107 can achieve electrical insulation of the first portion 113 from one kind of the first electrodes 121*a* and the second electrodes 121*b*, and providing the orthographic projection of the second portion 123 on the reference plane to be located in the orthographic projection of the insulating structure 107 on the reference plane is advantageous in ensuring that the insulating structure 107 can achieve electrical insulation of the second portion 123 from one kind of the first electrodes 121*a* and the second electrodes 121*b*.

In some embodiments, each cell 111 has a first edge region (not labeled in the figure) and a second edge region (not labeled in the figure) that are opposite in the first direction X, and the insulating structure 107 may cover the first edge region or the second edge region of a respective edge cell.

In some instances, referring to FIG. 2, 6, 10, or 12, the peripheral interconnection structure 104 is in electrical contact with the first solder ribbon structures 102*a* or the second solder ribbon structures 102*b*. If the peripheral interconnection structure 104 is in electrical contact with the first solder ribbon structures 102*a*, the peripheral interconnection structure 104 is separated by a separation structure 108 (refer to FIG. 10) from the electrodes 121 corresponding to the second solder ribbon structures 102*b*; and if the peripheral interconnection structure 104 is in electrical contact with the second solder ribbon structures 102*b*, the peripheral interconnection structure 104 is separated by a separation structure 108 (refer to FIG. 10) from the electrodes 121 corresponding to the first solder ribbon structures 102*a*. In one example, the peripheral interconnection structure 104 is in electrical contact with the first solder ribbon structures 102*a*, and there is a separation structure 108 between the peripheral interconnection structure 104 and the second electrodes 121*b* which are electrically connected to the second solder ribbon structures 102*b*.

It is to be noted that a positional relationship between the peripheral interconnection structure 104 and the separation structure 108 is similar to the positional relationship between the first portion 113 or the second portion 123 in the intermediate interconnection structure 103 and the insulating structure 107, which will not be described herein.

In other embodiments, in conjunction with reference to FIGS. 2, and 14 to 16, a corresponding insulating structure 107 of the insulating structures 107 may be located in gaps between the plurality of solder ribbon structures 102 in electrical contact with the respective intermediate interconnection structure 103 in the second direction Y and may cover a top surface of each of the first electrodes 121*a* of each of the corresponding pair of cells 111 or each of the second electrodes 121*b* of each of the corresponding pair of cells 111 in the third direction Z. It shall be noted that for the same or corresponding portions, reference may be made to those of the above-described embodiments, which will not be described herein.

Figure 14:
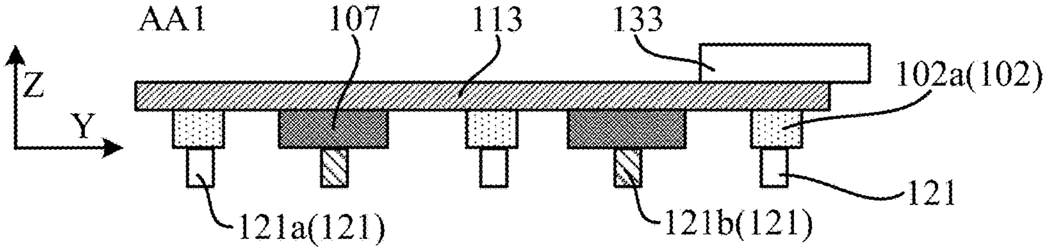
FIG. 14 is a schematic view of another partial cross-sectional structure of the photovoltaic module shown in FIG. 2 along the first cross-sectional direction AA1.
Figure 15:
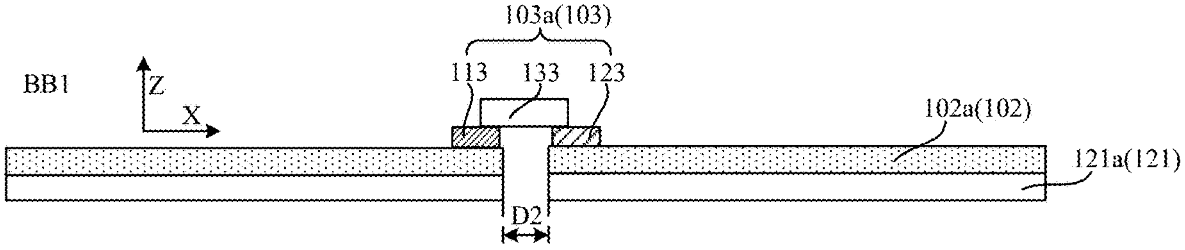
FIG. 15 is a schematic view of another partial cross-sectional structure of the photovoltaic module shown in FIG. 2 along the second cross-sectional direction BB1.
Figure 16:
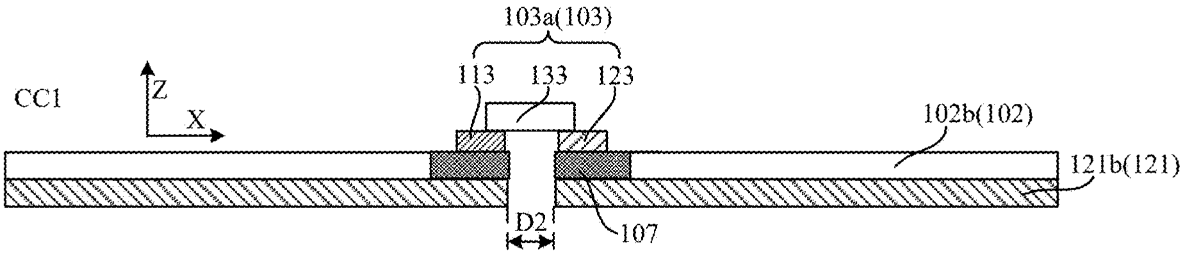
FIG. 16 is a schematic view of another partial cross-sectional structure of the photovoltaic module shown in FIG. 2 along the third cross-sectional direction CC1.

FIG. 14 is a schematic view of another partial cross-sectional structure of the photovoltaic module shown in FIG. 2 along the first cross-sectional direction AA1. FIG. 15 is a schematic view of another partial cross-sectional structure of the photovoltaic module shown in FIG. 2 along the second cross-sectional direction BB1. FIG. 16 is a schematic view of another partial cross-sectional structure of the photovoltaic module shown in FIG. 2 along the third cross-sectional direction CC1.

In some cases, if the intermediate interconnection structure 103 achieves parallel connection of the first edge cell 111*a* and the adjacent second edge cell 111*b* in the first direction X, the intermediate interconnection structure 103 may be in electrical contact with first solder ribbon structures 102*a* on the first edge cell 111*a* and the second edge cell 111*b*, second solder ribbon structures 102*b* on the first edge cell 111*a* and the second edge cell 111*b* do not extend onto adjacent edge regions of the first edge cell 111*a* and the second edge cell 111*b* in the first direction X. The edge region of the first edge cell 111*a* or the second edge cell 111*b* is one of the first edge region and the second edge region. The insulating structure 107 is located in the gap of any pair of the adjacent first solder ribbon structures 102*a* in the second direction Y, and the insulating structure 107 covers the top surface of each of second electrodes 121*b* of the first edge cell 111*a* and the second edge cell 111*b* in the third direction Z, to ensure the electrical insulation between the intermediate interconnection structure 103 and the second electrodes 121*b*.

It shall be noted that for any of the first edge cell 111*a* or any of the second edge cell 111*b*, the insulating structure 107 located at the edge region of the cell 111 is located in the gaps between the adjacent first solder ribbon structures 102*a*, and is located on the top surface of each of the second electrodes 121*b* not covered by a corresponding second solder ribbon structure 102*b*. Alternatively, the insulating structure 107 located at the edge region of the cell 111 is located in the gaps between the adjacent second solder ribbon structures 102*b* and is located on the top surface of each of the first electrodes 121*a* not covered by a corresponding first solder ribbon structure 102*a*.

It shall be noted that, in FIG. 14, the plurality of solder ribbon structures 102 in electrical contact with the respective intermediate interconnection structure 103 (refer to FIG. 2) are the first solder ribbon structures 102*a*, the corresponding insulating structure 107 covers the top surface of each of the second electrodes 121*b* in the third direction Z, and the insulating structure 107 and each of the first solder ribbon structures 102*a* are separated from each other in the second direction Y. In other words, the corresponding insulating structure 107 does not fully fill the gaps between the first solder ribbon structures 102*a* in the second direction Y. In practical applications, the corresponding insulating structure may also fully fill the gaps between the plurality of ribbon structures in electrical contact with the intermediate interconnection structure in the second direction.

It shall be understood that the corresponding insulating structure 107 may include a plurality of sub-insulating structures separated by the plurality of solder ribbon structures 102 in electrical contact with the intermediate interconnection structure 103.

Therefore, in the photovoltaic module 100, the respective intermediate interconnection structure 103 is used to collect the current on the first edge cell 111*a* and collect the current on the second edge cell 111*b*, and realize the electrical connection of two adjacent cell strings 101 in the first direction X. On this basis, the orthographic projection of the partial region of the intermediate interconnection structure 103 on the reference plane is designed to coincide with the orthographic projection of the cell 111 on the reference plane. In other words, the partial region of the intermediate interconnection structure 103 is located on the cell 111 in the third direction Z, such that the entire intermediate interconnection structure 103 does not need to be arranged in the gaps between the cells 101, so as to reduce the spacing between adjacent cells 101 in the first direction X while satisfying the electrical function of the intermediate interconnection structure 103. In this way, it is possible to reduce the area occupied by the intermediate interconnection structure 103 in the photovoltaic module 100, and increase the arrangement density of the cell strings 101 in the photovoltaic module 100, thereby improving the efficiency of the photovoltaic module 100.

Embodiments of the present disclosure further provide a method for manufacturing a photovoltaic module for manufacturing the photovoltaic module provided in the foregoing embodiments. Hereinafter, the method for manufacturing a photovoltaic module according to the embodiments of the present disclosure will be described in detail with reference to the drawings. It shall be noted that the same or corresponding portions as those of the foregoing embodiments will not be described herein.

Referring to FIG. 2, the method for manufacturing the photovoltaic module begins at S101. At S101, at least two cell strings 101 spaced apart from each other in a first direction X are provided, where each of the at least two cell strings 101 includes at least two cells 111 spaced apart from each other in the first direction X and electrically connected in sequence. Each of the at least two cells 111 includes a plurality of electrodes 121 arranged at intervals in a second direction Y, where the first direction X and the second direction Y intersect. The first direction X and the second direction Y define a reference plane. At S102, solder ribbon structures 102 are formed, where each respective solder ribbon structure 102 of the solder ribbon structures 102 is located on a corresponding cell 111 of the at least two cells 111 of a corresponding cell string 101 of the at least two cell strings 101, and the respective solder ribbon structure 102 is in electrical contact with a corresponding electrode 121 of the corresponding cell 111. At S103, intermediate interconnection structures 103 are formed at a non-end of the photovoltaic module 100 in the first direction X (i.e., a respective intermediate interconnection structure 103 of the intermediate interconnection structures 103 is not located at an end of the photovoltaic module 100 in the first direction X). In other words, a respective intermediate interconnection structure 103 of the intermediate interconnection structures 103 is electrically connected with a respective pair of adjacent cell strings 101 of the at least two cell strings 101, where one of the respective pair of adjacent cell strings 101 has a first edge 1111 facing another one of the respective pair of adjacent cell strings 101 and a first edge cell 111*a* adjacent the first edge 1111, the other one of the respective pair of adjacent cell strings 101 has a second edge 1112 facing the first edge cell 111*a* and a second edge cell 111*b* adjacent the second edge 1112, and the respective intermediate interconnection structure 103 is at least partially located near the first edge 1111 and the second edge 1112. The respective intermediate interconnection structure 103 includes a first portion 113, a second portion 123, and a lead-out structure 133. An orthographic projection of the first portion 113 on the reference plane overlaps an orthographic projection of the first edge cell 111*a* on the reference plane. The first portion 113 is in electrical contact with at least two solder ribbon structures 102 located on the first edge cell 111*a*. An orthographic projection of the second portion 123 on the reference plane overlaps an orthographic projection of the second edge cell 111*b* on the reference plane. The second portion 123 is in electrical contact with at least two solder ribbon structures 102 located on the second edge cell 111*b*. The lead-out structure 133 is located at least on a side of the respective intermediate interconnection structure 103 away from a corresponding pair of cells 111 (e.g., the first edge cell 111*a* and the second edge cell 111*b*) in a third direction Z, so that the intermediate interconnection structure 103 can electrically connect two adjacent cell strings 101 in the first direction X, where the third direction Z refers to a thickness direction of the corresponding pair of cells 111.

Hereinafter, various operations in the method for manufacturing the photovoltaic module according to the embodiments of the present disclosure will be described in detail.

In some embodiments, referring to FIG. 3 or FIG. 13, the electrodes 121 may include first electrodes 121*a* and second electrodes 121*b* spaced apart and alternatingly arranged in the second direction Y, where polarities of the first electrodes 121*a* and the second electrodes 121*b* are different.

In some embodiments, with reference to FIGS. 2 and 3, or with reference to FIGS. 2 and 13, each cell 111 is an IBC cell, and thus all the electrodes 121 are located on the back surface of the cell 111 in the third direction Z. In other words, the first electrodes 121*a* and the second electrodes 121*b* are located on the back surface of the cell 111 in the third direction Z. In other embodiments, the first electrodes may be located on one of the front surface and the back surface of the cell in the third direction, and the second electrodes may be located on the other of the front surface and the back surface of the cell in the third direction.

Hereinafter, various operations will be described in detail by taking the cell 111 as an IBC cell as an example.

Referring to FIGS. 2 to 5, before "forming the solder ribbon structures 102" at S102, the method may further include: forming insulating structures 107, where a respective insulating structure of the insulating structures is located at least on a portion of a top surface of each of electrodes 121 of each of a corresponding pair of cells 111, where a part of the respective insulating structure 107 is located in a peripheral region of the first edge cell 111*a* close to the second edge cell 111*b*, and a remaining part of the respective insulating structure 107 is located in a peripheral region of the second edge cell 111*b* close to the first edge cell 111*a*. It is to be noted that the peripheral region of the first edge cell 111*a* close to the second edge cell 111*b*, or the peripheral region of the second edge cell 111*b* close to the first edge cell 111*a* may be the first edge region or the second edge region described in the foregoing embodiments.

With continued reference to FIGS. 2 to 5, operations of "forming the solder ribbon structures 102" at S102 may include: forming a respective first solder ribbon structure 102*a* in electrical contact with a corresponding first electrode 121*a* of the first electrodes 121*a* of the electrodes 121 of the corresponding cell 111 and a respective second solder ribbon structure 102*b* in electrical contact with a corresponding second electrode 121*b* of the second electrodes 121*b* of the electrodes 121 of the corresponding cell 111. One of the respective first solder ribbon structure 102*a* and the respective second solder ribbon structure 102*b* corresponding to a same cell 111 includes a first segment 112, a third segment 132, and a second segment 122 in contact with the first segment 112 and the third segment 132. The first segment 112 is formed on a top surface of a corresponding electrode 121 that is not covered by the respective insulating structure 107. The third segment 132 is formed on a side of the respective insulating structure 107 away from the corresponding electrode 121 in the third direction Z.

It is to be noted that, before forming the solder ribbon structures 102, the insulating structure 107 may be formed in the region where the insulating structure 107 needs to be provided on the cell 111, and then the solder ribbon structures 102 may be formed, to realize the series connection between the plurality of cells 111 in the same cell string 101. The insulating structure 107 does not affect the series connection between the plurality of cells 111 in the same cell string 101.

In some examples, the electrodes 121 in the cell 111 each extend in the first direction X, and the electrode 121 may be a main busbar. The cell 111 may further include finger electrodes (not shown in the figure) each extending in the second direction Y. Before forming the solder ribbon structures 102, in the operations of forming the cells 111, an insulating material layer is also formed between the finger electrodes and the main busbars having different polarities. The insulating material layer and the insulating structure 107 can be formed in a same operation, which is beneficial to simplify the operations of forming the insulating structure 107 and reduce the cost of preparing the photovoltaic module.

In other embodiments, referring to FIG. 3, FIG. 13, or FIG. 14, the electrodes 121 may include first electrodes 121*a* and second electrodes 121*b* spaced apart and alternatingly arranged in the second direction Y. The polarities of the first electrodes 121*a* and the second electrodes 121*b* are different. The solder ribbon structures 102 includes first solder ribbon structures 102*a* and second solder ribbon structures 102*b*. Each respective first solder ribbon structure 102*a* of the first solder ribbon structures 102*a* is in electrical contact with a corresponding first electrode 121*a* of the first electrodes 121*a* of the electrodes 121 of the corresponding cell 111, and each respective second solder ribbon structure 102*b* of the second solder ribbon structures 102*b* is in electrical contact with a corresponding second electrode 121*b* of the second electrodes 121*b* of the electrodes 121 of the corresponding cell 111.

In some cases, with reference to FIGS. 2 and 3, or with reference to FIGS. 2 and 13, or with reference to FIGS. 2 and 14, the cell 111 is an IBC cell, all the electrodes 121 are located on the back surface of the cell 111 in the third direction Z. In other words, the first electrodes 121*a* and the second electrodes 121*b* are located on the back surface of the cell 111 in the third direction Z. In other embodiments, the first electrodes may be located on one of the front surface and the back surface of the cell in the third direction, and the second electrodes may be located on the other of the front surface and the back surface of the cell in the third direction.

Hereinafter, various operations will be described in detail by taking the cell 111 as an IBC cell as an example.

Referring to FIGS. 3 to 5, or referring to FIGS. 14 to 16, after "forming the solder ribbon structures 102" at S102 and before "forming the intermediate interconnection structures 103" at S103, the method may further include: forming insulating structures 107. A respective insulating structure of the insulating structures 107 is located at least in gaps between a plurality of first solder ribbon structures 102*a* corresponding to a same cell 111 in the second direction Y and located on a top surface of each of the second electrodes 121*b* of the same cell 111. Alternatively, a respective insulating structure of the insulating structures 107 is located at least in the gaps between the plurality of second solder ribbon structures 102*b* corresponding to the same cell 111 in the second direction Y, and located a top surface of each of the first electrodes 121*a* of the same cell 111.

It is to be noted that whether the insulating structure 107 is located on the top surface of each of the first electrodes 121*a* or the second electrodes 121*b* depends on whether the first solder ribbon structures 102*a* or the second solder ribbon structures 102*b* on the cell 111 corresponding to the insulating structure 107 are in electrical contact with the intermediate interconnection structure 103. For example, if the first solder ribbon structures 102*a* on the cell 111 corresponding to the insulating structure 107 are in electrical contact with the intermediate interconnection structure 103, the insulating structure 107 is located on the top surface of each of the second electrodes 121*b*. If the second solder ribbon structures 102*b* on the cell 111 corresponding to the insulating structure 107 are in electrical contact with the intermediate interconnection structure 103, the insulating structure 107 is located on the top surface of each of the first electrodes 121*a*. In addition, preparing the insulating structure 107 separately helps to specifically achieve electrical insulation between the intermediate interconnection structure 103 and part of the solder ribbon structures 102. Moreover, it is beneficial for further ensuring the insulation effect of the insulating structure 107 between the intermediate interconnection structure 103 and part of the solder ribbon structures 102.

In some embodiments, referring to FIGS. 3 to 5, after "forming the solder ribbon structures 102" at S102 and before "forming the intermediate interconnection structures 103" at S103, the method of forming the insulating structures 107 may include: inserting an insulating strip between a peripheral region corresponding to each of the first solder ribbon structures 102*a* or the second solder ribbon structures 102*b* corresponding to the same cell 111 and a corresponding electrode 121, so that the insulating strip is located on the top surface of the corresponding electrode 121. The insulating strip is the insulating structure 107.

It is to be noted that portions of the first or second solder ribbon structures 102*a*, 102*b* located in the peripheral region of the cell 111 and the electrodes 121 are not fixedly connected. In other words, the first solder ribbon structures 102*a* and the second solder ribbon structures 102*b* are flexible, and the portion of each of the first or second solder ribbon structures 102*a*, 102*b* located in the peripheral region of the cell 111 may be lifted in the third direction Z, so that there is a gap in the third direction Z between the portion of each of the first or second solder ribbon structures 102*a*, 102*b* located in the peripheral region of the cell 111 and the corresponding electrode 121, which may be used for inserting an insulating strip.

In one example, the insulating strip may be a long strip-shaped structure extending in the second direction Y.

In other cases, referring to FIGS. 14 to 16, after "forming the solder ribbon structures 102" at S102 and before "forming the intermediate interconnection structures 103" at S103, the method of forming the insulating structures 107 may include: spraying insulating glue. The insulating glue is located at least in the gaps between a plurality of first solder ribbon structures 102*a* corresponding to the same cell 111 in the second direction Y, and further located on the top surface of each of the second electrodes 121*b*. Alternatively, the insulating glue is located at least in the gaps between the plurality of second solder ribbon structures 102*b* corresponding to the same edge cell in the second direction Y, and further located on the top surface of each of the first electrodes 121*a*. The insulating glue is the insulating structure 107.

In one example, each insulating glue located on the top surface of one electrode 121 may be regarded as a sub-insulating structure, and the insulating structure 107 may include a plurality of sub-insulating structures, i.e., a plurality of insulating glues, separated by the plurality of solder ribbon structures 102 in electrical contact with the intermediate interconnection structure 103.

Those skilled in the art will understand that the above-described embodiments are specific embodiments for implementing the present disclosure, and in practical application, various changes in form and details can be made thereto without departing from the spirit and scope of the embodiments of the present disclosure. Any person skilled in the art can make various changes and modifications without departing from the spirit and scope of the embodiments of the present disclosure, and therefore, the scope of protection of the embodiments of the present disclosure should be based on the scope defined by the claims.

What is claimed is:

1. A photovoltaic module, comprising:

at least two cell strings spaced apart from one another in a first direction and electrically connected in sequence, wherein each respective cell string of the at least two cell strings includes at least two cells spaced apart from one another in the first direction and electrically connected in sequence, wherein each of the at least two cells includes electrodes arranged at intervals in a second direction intersecting the first direction, and the first direction and the second direction define a reference plane;

solder ribbon structures, wherein a respective solder ribbon structure of the solder ribbon structures is disposed on a corresponding cell of the at least two cells of a corresponding cell string of the at least two cell strings, and the respective solder ribbon structure is in electrical contact with a corresponding electrode of the electrodes of the corresponding cell; and intermediate interconnection structures, wherein a respective intermediate interconnection structure of the intermediate interconnection structures is electrically connected with a respective pair of adjacent cell strings of the at least two cell strings, wherein a first one of the respective pair of adjacent cell strings has a first edge and a first edge cell adjacent the first edge, the first edge facing a second one of the respective pair of adjacent cell strings, the second one of the respective pair of adjacent cell strings has a second edge and a second edge cell adjacent the second edge, the second edge facing the first edge cell, and the respective intermediate interconnection structure is at least partially located near the first edge and the second edge;

wherein the respective intermediate interconnection structure includes a first portion, a second portion, and a lead-out structure, wherein an orthographic projection of the first portion on the reference plane overlaps an orthographic projection of the first edge cell on the reference plane, and the first portion is in electrical contact with at least two solder ribbon structures disposed on the first edge cell, wherein an orthographic projection of the second portion on the reference plane overlaps an orthographic projection of the second edge cell on the reference plane, and the second portion is in electrical contact with at least two solder ribbon structures disposed on the second edge cell, wherein a first part of the lead-out structure is located on a side of the first portion away from the first edge cell in a third direction, and a second part of the lead-out structure is located on a side of the second portion away from the second edge cell in the third direction, wherein the third direction is along a thickness direction of the first edge cell and the second edge cell.

2. The photovoltaic module of claim 1, wherein each two adjacent cells in the first direction in a same cell string are spaced by a first spacing, the first edge cell and the second edge cell in the first direction are spaced by a second spacing, and a ratio of the second spacing to the first spacing is in a range of 0.9 to 1.1.

3. The photovoltaic module of claim 1, wherein the first portion and the second portion are spaced by a first distance in the first direction, and the lead-out structure is in contact with at least a portion of a top surface of each of the first portion and the second portion away from the first edge cell and the second edge cell in the third direction.

4. The photovoltaic module of claim 3, wherein the lead-out structure is further in contact with at least a portion of each of at least one side surface, extending in the third direction, of each of at least one of the first portion and the second portion.

5. The photovoltaic module of claim 4, wherein the first portion includes a first side surface adjacent to the second portion in the first direction, and the lead-out structure is only in contact with at least part of the first side surface.

6. The photovoltaic module of claim 3, wherein the lead-out structure includes a contact portion and a lead-out portion that are connected with each other in the third direction, wherein the contact portion is in contact with both the first portion and the second portion, and the lead-out portion is located on a side of the contact portion away from the first edge cell and the second edge cell in the third direction;

wherein the contact portion has a first width in the first direction, and the first width is larger than the first distance.

7. The photovoltaic module of claim 6, wherein the contact portion includes a first sub-contact portion and a second sub-contact portion, the first sub-contact portion faces the first portion in the third direction, and the second sub-contact portion faces the second portion in the third direction;

wherein in the first direction, the first sub-contact portion has a second width, the first portion has a third width, and a ratio of the second width to the third width is greater than or equal to 0.4.

8. The photovoltaic module of claim 6, wherein the contact portion includes a first sub-contact portion and a second sub-contact portion, the first sub-contact portion faces the first portion in the third direction, and the second sub-contact portion faces the second portion in the third direction;

wherein in the first direction, the second sub-contact portion has a fourth width, the second portion has a fifth width, and a ratio of the fourth width to the fifth width is greater than or equal to 0.4.

9. The photovoltaic module of claim 6, wherein the first width is greater than or equal to 2 mm in the first direction.

10. The photovoltaic module of claim 6, wherein the contact portion includes a first sub-contact portion and a second sub-contact portion, the first sub-contact portion faces the first portion in the third direction, and the second sub-contact portion faces the second portion in the third direction;

wherein in the second direction, the first sub-contact portion has a first length, the first portion has a second length, and a ratio of the first length to the second length is less than or equal to ⅓.

11. The photovoltaic module of claim 6, wherein the contact portion includes a first sub-contact portion and a second sub-contact portion, the first sub-contact portion faces the first portion in the third direction, and the second sub-contact portion faces the second portion in the third direction;

wherein in the second direction, the second sub-contact portion has a third length, the second portion has a fourth length, and a ratio of the third length to the fourth length is less than or equal to ⅓.

12. The photovoltaic module of claim 1, wherein the respective intermediate interconnection structure further includes a third portion, the third portion is located between the first portion and the second portion, and the third portion is in contact with both the first portion and the second portion;

wherein each two adjacent cells in a same cell string in the first direction are spaced by a first spacing, the respective intermediate interconnection structure has a sixth width greater than the first spacing in the first direction, and the lead-out structure is in contact with at least a portion of a top surface of the respective intermediate interconnection structure away from the first edge cell and the second edge cell in the third direction.

13. The photovoltaic module of claim 12, wherein the lead-out structure has a seventh width in the first direction, and the seventh width is less than or equal to the sixth width.

14. The photovoltaic module of claim 12, wherein the contact portion is connected with at least one of the first portion, the second portion, and the third portion.

15. The photovoltaic module of claim 1, wherein the photovoltaic module has a plurality of peripheral cells located at both ends of the photovoltaic module respectively in the first direction;

wherein the photovoltaic module further comprises:

a plurality of peripheral interconnection structures, wherein an orthographic projection of each respective peripheral interconnection structure of the plurality of peripheral interconnection structures and an orthographic projection of a respective peripheral cell of the plurality of peripheral cells on the reference plane overlap, and the respective peripheral interconnection structure is in electrical contact with at least two solder ribbon structures disposed on the respective peripheral cell of which orthographic projection on the reference plane overlaps that of the respective peripheral interconnection structure on the reference plane.

16. The photovoltaic module of claim 1, wherein the electrodes include first electrodes and second electrodes spaced and alternatingly arranged in the second direction, polarities of the first electrodes and the second electrodes are different, wherein the solder ribbon structures include first solder ribbon structures and second solder ribbon structures, wherein each respective first solder ribbon structure of the first solder ribbon structures is in electrical contact with a corresponding first electrode of the electrodes of the corresponding cell, and each respective second solder ribbon structure of the second solder ribbon structures is in electrical contact with a corresponding second electrode of the electrodes of the corresponding cell, wherein the intermediate interconnection structures include first intermediate interconnection structures and second intermediate interconnection structures, wherein each of the first intermediate interconnection structures is in electrical contact with at least two first solder ribbon structures disposed on a corresponding pair of cells and each of the second intermediate interconnection structures is in electrical contact with at least two second solder ribbon structures disposed on a corresponding pair of cells;

wherein the photovoltaic module further comprises:

insulating structures at least located between the first intermediate interconnection structures and second electrodes of corresponding cells, and between the second intermediate interconnection structures and first electrodes of corresponding cells.

17. The photovoltaic module of claim 16, wherein each of a plurality of solder ribbon structures in electrical contact with the respective intermediate interconnection structure include a first segment, a third segment, and a second segment that connects the first segment and the third segment, wherein the first segment is in a same layer as at least a portion of a corresponding insulating structure of the insulating structures, the third segment is located on a side of the corresponding insulating structure away from a corresponding electrode in the third direction, and the third segment is located between the corresponding insulating structure and the respective intermediate interconnection structure;

wherein an orthographic projection of the first portion on the reference plane is located in the orthographic projection of the corresponding insulating structure on the reference plane, and an orthographic projection of the second portion on the reference plane is located in the orthographic projection of the corresponding insulating structure on the reference plane.

18. The photovoltaic module of claim 16, wherein a corresponding insulating structure of the insulating structures is further located in gaps between a plurality of solder ribbon structures in electrical contact with the respective intermediate interconnection structure in the second direction and covers a top surface of each of the first electrodes of each of the corresponding pair of cells or each of the second electrodes of each of the corresponding pair of cells in the third direction.

19. The photovoltaic module of claim 1, wherein each of the at least two cells includes a back contact solar cell, and the solder ribbon structures and the intermediate interconnection structures are located on back surfaces of back contact solar cells of the at least two cell strings.

20. The photovoltaic module of claim 1, wherein the photovoltaic module further comprises connection structures, wherein a respective connection structure is in electrical contact with a corresponding pair of adjacent peripheral interconnection structures in the second direction.

* * * * *